(12) United States Patent
Grossman et al.

(10) Patent No.: US 10,943,982 B2
(45) Date of Patent: Mar. 9, 2021

(54) NANOPOROUS SEMICONDUCTOR MATERIALS

(71) Applicant: Massachusetts Institute of Technology, Cambridge, MA (US)

(72) Inventors: Jeffrey C. Grossman, Brookline, MA (US); Brendan Derek Smith, Cambridge, MA (US); Jatin Jayesh Patil, Brampton (CA); Nicola Ferralis, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/127,817

(22) Filed: Sep. 11, 2018

(65) Prior Publication Data

US 2019/0088748 A1    Mar. 21, 2019

Related U.S. Application Data

(62) Division of application No. 15/462,620, filed on Mar. 17, 2017, now Pat. No. 10,128,341.

(60) Provisional application No. 62/310,474, filed on Mar. 18, 2016.

(51) Int. Cl.
| H01L 29/32 | (2006.01) |
| H01L 21/308 | (2006.01) |
| H01L 21/306 | (2006.01) |
| H01L 29/16 | (2006.01) |

(52) U.S. Cl.
CPC .......... H01L 29/32 (2013.01); H01L 21/3081 (2013.01); H01L 21/30604 (2013.01); H01L 29/16 (2013.01)

(58) Field of Classification Search
CPC ..... H01L 29/32; H01L 29/34; H01L 21/3081; H01L 21/30604
See application file for complete search history.

(56) References Cited

U.S. PATENT DOCUMENTS

| 6,790,785 B1 | 9/2004 | Li et al. |
| 7,843,562 B2 | 11/2010 | Chan et al. |
| 8,299,613 B2 | 10/2012 | Oppermann |
| 8,722,196 B2 * | 5/2014 | Yae ................. C23C 18/1619 428/450 |
| 9,028,982 B2 | 5/2015 | Yae et al. |
| 10,128,341 B2 | 11/2018 | Grossman et al. |

(Continued)

FOREIGN PATENT DOCUMENTS

| CN | 1922486 | 2/2007 |
| CN | 101960045 | 1/2011 |

(Continued)

OTHER PUBLICATIONS

International Search Report and Written Opinion dated Jun. 28, 2017 for Application No. PCT/US2017/022880.

(Continued)

*Primary Examiner* — Quoc D Hoang
(74) *Attorney, Agent, or Firm* — Wolf, Greenfield & Sacks, P.C.

(57) ABSTRACT

Methods for forming nanoporous semiconductor materials are described. The methods allow for the formation of micron-scale arrays of sub-10nm nanopores in semiconductor materials with narrow size distributions and aspect ratios of over 400:1.

11 Claims, 18 Drawing Sheets

(56) References Cited

U.S. PATENT DOCUMENTS

| | | | |
|---|---|---|---|
| 2002/0170875 A1 | 11/2002 | Benzel et al. | |
| 2002/0192680 A1 | 12/2002 | Chan et al. | |
| 2003/0116531 A1 | 6/2003 | Kamins et al. | |
| 2007/0007241 A1 | 1/2007 | DeLause et al. | |
| 2010/0139772 A1* | 6/2010 | Frank | H01G 9/2031 136/261 |
| 2013/0034714 A1* | 2/2013 | Canham | A61K 8/25 428/219 |
| 2013/0081679 A1 | 4/2013 | Besmann et al. | |
| 2013/0292839 A1* | 11/2013 | Fukami | C01B 33/02 257/773 |
| 2014/0048126 A1 | 2/2014 | Dorval Courchesne et al. | |
| 2016/0194779 A1* | 7/2016 | Umemoto | C25D 11/18 428/307.3 |
| 2017/0237234 A1 | 8/2017 | Han et al. | |
| 2017/0271459 A1 | 9/2017 | Grossman et al. | |
| 2019/0074212 A1 | 3/2019 | Goller et al. | |
| 2019/0148570 A1 | 5/2019 | Chen et al. | |
| 2019/0312112 A1 | 10/2019 | Grossman et al. | |

FOREIGN PATENT DOCUMENTS

| | | |
|---|---|---|
| CN | 103210029 | 7/2013 |
| CN | 105408102 | 3/2016 |
| EP | 2439766 A1 | 4/2012 |
| WO | WO 2013/093504 A2 | 6/2013 |
| WO | WO 2014/152435 A1 | 9/2014 |
| WO | WO 2017/161224 A1 | 9/2017 |
| WO | WO 2018/112297 A1 | 6/2018 |

OTHER PUBLICATIONS

International Preliminary Report on Patentability dated Sep. 27, 2018 for Application No. PCT/US2017/022880.
Achar et al., Fabrication of ultrathin silicon nanoporous membranes and their application in filtering industrially important biomolecules. IEEE Trans Nanotechnol; Jul. 2013;12(4):583-88.
Alam et al., Oxygen plasma and humidity dependent surface analysis of silicon, silicon dioxide and glass for direct wafer bonding. ECS J Solid State Sci Technol. 2013;2(12):p. 515-23. Epub Oct. 22, 2013.
Andreazza et al., Nucleation and initial growth of platinum islands by plasma sputter deposition. Surf Coatings Technol. Mar. 1, 2002;151-152:122-7.
Andrew et al., Confining light to deep subwavelength dimensions to enable optical nanopatterning. Science. May 15, 2009;324(5929):917-21. doi: 10.1126/science.1167704. Epub Apr. 9, 2009.
Aqra et al., Surface free energy of alkali and transition metal nanoparticles. Appl Surf Sci. Sep. 30, 2014;314:308-13. Epub Jul. 9, 2014.
Asoh et al., Effect of noble metal catalyst species on the morphology of macroporous silicon formed by metal-assisted chemical etching. Electrochim Acta. 2009;54:5142-5148. Epub Jan. 24, 2009.
Asoh et al., Sub-100-nm ordered silicon hole arrays by metal-assisted chemical etching. Nanoscale Res Lett. Oct. 4, 2013;8(1):410(1-8). doi: 10.1186/1556-276X-8-410.
Bai et al., Titanium dioxide nanomaterials for sensor applications. Chem Rev. 2014;114(19):10131-76. Epub Jun. 12, 2014.
Bal et al., Interfacial role in room-temperature diffusion of Au into Si substrates. Phys. Rev. B: Condens Matter Mater Phys. 2007;75: 205411(1-6). Epub May 8, 2007.
Bang et al., Mass production of uniform-sized nanoporous silicon nanowire anodes via block copolymer lithography. Energy Environ Sci. 2011;4:3395-9. Epub Aug. 1, 2011.
Bennett et al., Efficient thermoelectric performance in silicon nano-films by vacancy-engineering. Nano Energy. Sep. 2015;16:350-6. Epub Jul. 20, 2015.
Benoit et al., Formation of Si nanowire arrays by metal-assisted chemical etching. ECS Trans. 2008;16(3):245-52.
Booker et al., Metal-assisted chemical etching for very high aspect ratio grooves in n-type silicon wafers. J Michromech Microeng. Nov. 2014;24(12):125026(6pgs).
Branz et al., Nanostructured black silicon and the optical reflectance of graded-density surfaces. Appl Phys Lett. Jun. 2009;94(23):23112, 3 pages. Epub Jun. 11, 2009.
Chang et al., Densely packed arrays of ultra-high-aspect-ratio silicon nanowires fabricated using block-copolymer lithography and metal-assisted etching. Adv Funct Mater. Aug. 2009;19(15):2495-500.
Chang et al., Ultra-high aspect ratio high-resolution nanofabrication for hard X-ray diffractive optics. Nat Commun. Jun. 27, 2014;5:4243(1-7). doi: 10.1038/ncomms5243.
Chartier et al., Metal-assisted chemical etching of silicon in $HF-H_2O_2$. Electrochim Acta. Jul. 1, 2008;53(17):5509-16. Epub Mar. 13, 2008.
Chen et al., Titanium dioxide nanomaterials: synthesis, properties, modifications, and applications. Chem Rev. Jul. 2007;107(7):2891-959. Epub Jun. 23, 2007.
Chen et al., Wafer-scale synthesis of single-crystal zigzag silicon nanowire arrays with controlled turning angles. Nano Lett. Mar. 10, 2010;10(3):864-8. doi: 10.1021/nl903391x.
Chern et al., Nonlithographic patterning and metal-assisted chemical etching for manufacturing of tunable light-emitting silicon nanowire arrays. Nano Lett. May 12, 2010;10(5):1582-8. doi: 10.1021/nl903841a. Epub Apr. 27, 2010.
Chong et al., Nanoporous silicon produced by metal-assisted etching: a detailed investigation of optical and contact properties for solar cells. IEEE J Photovoltaics. Mar. 2015;5(2):538-44.
Conrad et al., Influence of surface defects on the nucleation and growth of thin discontinuous gold films. Int J Electron. 1990;69(1):153-67.
Dawood et al., Influence of catalytic gold and silver metal nanoparticles on structural, optical, and vibrational properties of silicon nanowires synthesized by metal-assisted chemical etching. J Appl Phys. 2012; 112(7):073509(1-8). doi: 10.1063/1.4757009. Epub Oct. 4, 2012.
Deng et al., Characterization of nanoporous silicon-based DNA biosensor for the detection of *Salmonella enteritidis*. IEEE Sensors Journal. Jun. 2008;8(6):775-80.
Desai et al., Nanoporous anti-fouling silicon membranes for bio-sensor applications. Biosens Bioelectron. 2000;15(9-10):453-62.
Dzhafarov et al., Effect of nanoporous silicon coating on silicon solar cell performance. Vacuum, 2012;86(12):1875-79.
Elam et al., Conformal coating on ultrahigh-aspect-ratio nanopores of anodic alumina by atomic layer deposition. Chem Mater. 2003;15(18):3507-17.
Faustini et al., Ultraporous nanocrystalline $TiO_2$-based films: synthesis, patterning and application as anti-reflective, self-cleaning, superhydrophilic coatings. Nanoscale. Dec. 14, 2015;7(46):19419-25. doi: 10.1039/c5nr06466j. Epub Oct. 28, 2015.
Fujishima et al., $TiO_2$ photocatalysis and related surface phenomena. Surf. Sci. Rep. 2008;63:515-582.
Gaborski et al., High-performance separation of nanoparticles with ultrathin porous nanocrystalline silicon membranes. ACS Nano. Nov. 23, 2010;4(11):6973-81. doi: 10.1021/nn102064c. Epub Nov. 2, 2010.
Gebhard et al., An efficient PE-ALD process for $TiO_2$ thin films employing a new Ti-precursor. J Mater Chem C. 2016;4:1057-65. Epub Jan. 11, 2016.
Geyer et al., Model for the mass transport during metal-assisted chemical etching with contiguous films as catalysts. J Phys Chem C. 2012;116:13446-13451. Epub May 24, 2012.
Graf et al., Silicon surface treatments and their impact on chemical composition and morphology. Mater Res Soc Symp Proc. 1993;315:23-33.
Guder et al., Tracing the migration history of metal catalysts in metal-assisted chemically etched silicon. ACS Nano. Feb. 26, 2013;7(2):1583-90. doi: 10.1021/nn305413r. Epub Feb. 5, 2013.
Guo et al., Thermal transport in nanoporous Si: Anisotropy and junction effects. Int J Heat Mass Transfer. Oct. 2014;77:131-9. Epub Jun. 5, 2014.
Harada et al., Catalytic amplification of the soft lithographic patterning of Si. Nonelectrochemical orthogonal fabrication of

(56) References Cited

OTHER PUBLICATIONS photoluminescent porous Si pixel arrays. J Am Chem Soc. Sep. 12, 2001;123(36):8709-17. Epub Aug. 16, 2001.

Hashimoto et al., $TiO_2$ photocatalysis: a historical overview and future prospects. Jpn J Appl Phys. 2005;44(12):8269-8285.

Homan et al., Silica-coated gold nanoparticles: surface chemistry, properties, benefits and applications. Sigma-Aldrich Catalog, http://www.sigmaaldrich.com/technical-documents/articles/materials-science/silica-coated-gold-nanoparticles.html, accessed on the internet Oct. 10, 2017, 7 pages.

Hsu et al., Fabrication and characteristics of black silicon for solar cell applications: An overview. Mater Sci Semicond Process. 2014;25:2-17. Epub Feb. 20, 2014.

Huang et al., Extended arrays of vertically aligned sub-10 nm diameter [100] Si nanowires by metal-assisted chemical etching. Nano Lett. Sep. 2008;8(9):3046-51. doi: 10.1021/nl802324y. Epub Aug. 13, 2008.

Huang et al., Fabrication of nanoporous antireflection surfaces on silicon. Sol Energy Mater & Sol Cells. 2008;92:1352-7. Epub Jul. 1, 2008.

Huang et al., Metal-assisted chemical etching of silicon: a review. Adv Mater. Jan. 11, 2011;23(2):285-308. doi: 10.1002/adma. 201001784.

Ivanov et al., Electrochemical performance of nanoporous Si as anode for lithium ion batteries in alkyl carbonate and ionic liquid-based electrolytes. J Appl Electrochem. Jan. 2014;44(1):159-68. Epub Aug. 30, 2013.

Kemmenoe et al., Structure analysis of sputter-coated and ion-beam sputter-coated films: a comparative study. J Microsc. Nov. 1983;132(Pt 2):153-63.

Kim et al., Three-dimensional porous silicon particles for use in high-performance lithium secondary batteries. Angew Chem Int Ed Engl. 2008;47(52):10151-4. doi: 10.1002/anie.200804355.

Klankowski et al., A novel high-power battery-pseudocapacitor hybrid based on fast lithium reactions in silicon anode and titanium dioxide cathode coated on vertically aligned carbon nanofibers. Electrochimica Acta, 2015;178:797-805. Epub Aug. 21, 2015.

Lai et al., Mechanics of catalyst motion during metal assisted chemical etching of silicon. J Phys Chem C. Sep. 2013;117(40):20802-9.

Lee et al., Ballistic phonon transport in holey silicon. Nano Lett. May 13, 2015;15(5):3273-9. doi: 10.1021/acs.nanolett.5b00495. Epub Apr. 10, 2015.

Lee et al., Nanoporous Si as an efficient thermoelectric material. Nano Lett. Nov. 2008;8(11):3750-4. doi: 10.1021/nl802045f. Epub Oct. 24, 2008.

Lee et al., Pore formation in silicon by wet etching using micrometre-sized metal particles as catalysts. J Mater Chem. 2008;18:1015-20. Epub Jan. 21, 2008.

Letant et al., Functionalized silicon membranes for selective bio-organism capture. Nat Mater. Jun. 2003;2(6):391-5; Suppl Info 1 page. Epub Apr. 27, 2003.

Li et al., Computational modeling and analysis of thermoelectric properties of nanoporous silicon. J Appl Phys. 2014;115(12):124316(1-14).

Li et al., Metal-assisted chemical etching in $HF/H_2O_2$ produces porous silicon. Appl. Phys. Lett. Oct. 16, 2000;77(16):2572-4.

Li, Metal assisted chemical etching for high aspect ratio nanostructures: A review of characteristics and applications in photovoltaics. Curr Opin Solid State Mater Sci. Apr. 2012;16(2):71-81. Epub Dec. 13, 2011.

Liu et al., Anisotropic nanoparticles as shape-directing catalysts for the chemical etching of silicon. J Am Chem Soc. Aug. 21, 2013;135(33):12196-9. doi: 10.1021/ja4061867. Epub Aug. 1, 2013.

Liu et al., Fabrication of bifacial wafer-scale silicon nanowire arrays with ultra-high aspect ratio through controllable metal-assisted chemical etching. Mater Lett. Jan. 15, 2015;139:437-42. Epub Nov. 4, 2014.

Liu et al., Hard mask free DRIE of crystalline Si nanobarrel with 6.7nm wall thickness and 50:1 aspect ratio. 2015 28$^{th}$ IEEE Int Conf Micro Electro Mech Syst (MEMS). Date of Conference Jan. 18-22, 2015 Estoril, Portugal; Pub Mar. 2, 2015; pp. 77-80.

Liu et al., Low-temperature plasma etching of high aspect-ratio densely packed 15 to sub-10 nm silicon features derived from PS-PMDS block copolymer patterns. Nanotechnology. Jun. 2014;25(28):285301(1-8).

Lu et al., Anti-reflection layers fabricated by a one-step copper-assisted chemical etching with inverted pyramidal structures intermediate between texturing and nanopore-type black silicon. J Mater Chem A. 2014;2:12043-52. Epub Jun. 4, 2014.

Lu et al., Nanopore-type black silicon anti-reflection layers fabricated by a one-step silver-assisted chemical etching. Phys Chem Chem Phys. Jun. 28, 2013;15(24):9862-70. doi: 10.1039/c3cp51835c. Epub May 8, 2013.

Manfrinato et al., Determining the resolution limits of electron-beam lithography: direct measurement of the point-spread function. Nano Lett. Aug. 13, 2014;14(8):4406-12. doi: 10.1021/nl5013773. Epub Jun. 24, 2014.

Mao et al., Fabrication of porous $TiO_2$—$SiO_2$ multifunctional anti-reflection coatings by sol-gel spin coating method. RSC Adv. 2014;4:58101-7. Epub Oct. 30, 2014.

Min et al., The role of interparticle and external forces in nanoparticle assembly. Nat Mater. Jul. 2008;7(7):527-38. doi: 10.1038/nmat2206.

Mine et al., Direct coating of gold nanoparticles with silica by a seeded polymerization technique. J Colloid Interface Sci. Aug. 15, 2003;264(2):385-90.

Nakata et al., $TiO_2$ photocatalysis: Design and applications. J. Photochem. Photobiol. C. 2012;13:169-89, doi:10.1016/j.jphotochemrev. 2012.06.001. Epub Jun. 9, 2012.

Nomura et al., Room-temperature fabrication of transparent flexible thin-film transistors using amorphous oxide semiconductors. Nature. Nov. 25, 2004;432(7016):488-92.

Oh et al., Nanoporous black silicon photocathode for H2 production by photoelectrochemical water splitting. Energy Environ. Sci 2011;4:1690-4. Epub Apr. 5, 2011.

Parasuraman et al., Deep reactive ion etching of sub-micrometer trenches with ultra high aspect ratio. Microelectronic Engineering. Jan. 2014;113:35-9. Epub Jul. 17, 2013.

Park et al., Synthesis and electrochemical characterization of anode material with titanium-silicon alloy solid core/nanoporous silicon shell structures for lithium rechargeable batteries. J Power Sources. Dec. 2015;299:537-43. Epub Sep. 21, 2015.

Pecora et al., Nanopatterning of silicon nanowires for enhancing visible photoluminescence. Nanoscale. Apr. 28, 2012;4(9):2863-6. doi: 10.1039/c2nr30165b. Epub Mar. 2, 2012.

Peng et al., Motility of metal nanoparticles in silicon and induced anisotropic silicon etching. Adv Funct Mater. Oct. 9, 2008;18(19):3026-35. Epub Sep. 22, 2008.

Perrey et al., Insights into nanoparticle formation mechanisms. J Mater Sci. May 2006;41:2711-22. Epub Apr. 17, 2006.

Reiners et al., Growth and crystallization of $TiO_2$ thin films by atomic layer deposition using a novel amido guanidinate titanium source and tetrakis-dimethylamido-titanium. Chem Mater. 2013;25(15):2934-43. Epub Jul. 2, 2013.

Scheeler et al., Fabrication of porous silicon by metal-assisted etching using highly ordered gold nanoparticle arrays. Nanoscale Res Lett. Aug. 9, 2012;7(1):450(1-7). doi: 10.1186/1556-276X-7-450.

Shi et al., Electronic and optical properties of nanoporous silicon for solar-cell applications. ACS Phototonics. 2015;2(2):208-15. Epub Dec. 2, 2014.

Shi et al., Nanoporous black multi-crystalline silicon solar cells: realization of low reflectance and explanation of high recombination loss. Mater Sci Semicond Process. Apr. 2013;16(2):441-8. Epub Sep. 28, 2012.

Smith et al., Catalyst self-assembly for scalable patterning of sub 10 nm ultrahigh aspect ratio nanopores in silicon. ACS Appl Mater Interfaces. Mar. 2016;8(12):8043-9. doi: 10.1021/acsami.6b01927. Epub Mar. 21, 2016.

Smith et al., Mechanism of nanowire formation in metal assisted chemical etching. Electrochim Acta. Mar. 2013;92:139-47. Epub Jan. 5, 2013.

(56) References Cited

OTHER PUBLICATIONS

Striemer et al., Charge- and size-based separation of macromolecules using ultrathin silicon membranes. Nature. Feb. 15, 2007;445(7129):749-53.

Tang et al., Holey silicon as an efficient thermoelectric material. Nano Lett. Oct. 13, 2010;10(10):4279-83. doi: 10.1021/nl102931z. Epub Sep. 14, 2010.

Tong et al., Surface plasmon resonance properties of DC magnetron sputtered Ag nanoislands on ITO-glass and $In_2O_3$-PET substrates. Electronics Letters. Apr. 10, 2014;50(8):623-634. doi: 10.1049/el.2014.0442.

Toor et al., Multi-scale surface texture to improve blue response of nanoporous black silicon solar cells. Appl. Phys. Lett. 2011;99:103501(1-3). Epub Sep. 6, 2011.

Tsujino et al., Boring deep cylindrical nanoholes in silicon using silver nanoparticles as a catalyst. Adv Mater. Apr. 18, 2005;17(8):1045-1047.

Tsujino et al., Morphology of nanoholes formed in silicon by wet etching in solutions containing HF and $H_2O_2$ at different concentrations using silver nanoparticles as catalysts. Electrochim Acta. 2007; 53:28-34. Epub Jan. 30, 2007.

Uhlir, Electrolytic shaping of germanium and silicon. Bell System Tech J. 1956; 35(2):333-347.

Usher, The contribution of kinetic nucleation theories to studies of Volmer-Weber thin film growth. Appl Surf Sci. May 1985;22-23(Part 2):506-11.

Vanderkooy et al., Silica shell/gold core nanoparticles: correlating shell thickness with the plasmonic red shift upon aggregation. ACS Appl Mater Interfaces. Oct. 2011;3(10):3942-7. doi: 10.1021/am200825f. Epub Sep. 1, 2011.

Vitos et al., The surface energy of metals. Surf Sci. 1998;411:186-202.

Wen et al., Ultra-large-area self-assembled monolayers of nanoparticles. ACS Nano. Nov. 22, 2011;5(11):8868-76. doi: 10.1021/nn2037048. Epub Oct. 25, 2011.

Wu et al., Fabrication of wafer-size monolayer close-packed colloidal crystals via slope self-assembly and thermal treatment. Langmuir. Nov. 19, 2013;29(46):14017-23. doi: 10.1021/la402652t. Epub Oct. 22, 2013.

Wu et al., Thermoporometry characterization of silica microparticles and nanowires. Langmuir. Mar. 4, 2014;30(8):2206-15. doi: 10.1021/la404419h. Epub Feb. 15, 2014.

Yang et al., Basic principles for rational design of high-performance nanostructured silicon-based thermoelectric materials. Chemphyschem. Dec. 23, 2011;12(18):3614-8. doi: 10.1002/cphc.201100514. Epub Oct. 20, 2011.

Yoon et al., Direct visualization of etching trajectories in metal-assisted chemical etching of Si by the chemical oxidation of porous sidewalls. Langmuir. Sep. 29, 2015;31(38):10549-54. doi: 10.1021/acs.langmuir.5b02453. Epub Sep. 9, 2015.

Yu et al., Reversible storage of lithium in silver-coated three-dimensional macroporous silicon. Adv Mater. May 25, 2010;22(20):2247-50. doi: 10.1002/adma.200903755.

Yuan et al., Efficient black silicon solar cell with a density-graded nanoporous surface: Optical properties, performance limitations, and design rules. Appl Phys Lett. 2009;95(12):123501(1-3). Epub Sep. 22, 2009.

Zhang et al., Double-layered $TiO_2$—$SiO_2$ nanostructured films with self-cleaning and antireflective properties. J Phys Chem B. Dec. 21, 2006;110(50):25142-8.

Zhang et al., Preparation of large-area uniform silicon nanowires arrays through metal-assisted chemical etching. J Phys Chem C. 2008;112(12):4444-50.

Zhu et al., Formation of silicon nanoporous structures induced by colloidal gold nanoparticles in $HF/H_2O_2$ solutions. Chem Mater. Jul. 2009;21(13):2721-6. Epub May 22, 2009.

Almecija et al., Influence of the cleaning temperature on the permeability of ceramic membranes. Desalination. Sep. 15, 2009;245(1-3):708-13.

Bai et al., Graphene nanomesh. Nat Nanotechnol. Mar. 2010;5(3):190-4. doi: 10.1038/nnano.2010.8. Epub Feb. 14, 2010. Author Manuscript, 11 pages.

Celebi et al., Ultimate permeation across atomically thin porous graphene. Science. Apr. 18, 2014;344(6181):289-92. doi: 10.1126/science.1249097.

Chakraborty et al., Symmetry-dependent phonon renormalization in monolayer MoS2 transistor. Phys Rev B. 2012;85:161403R(1-4).

Cohen-Tanugi et al., Water desalination across nanoporous graphene. Nano Lett. Jul. 11, 2012;12(7):3602-8. doi: 10.1021/nl3012853. Epub Jun. 5, 2012.

Cromey et al., Effect of elevated temperature on ceramic ultrafiltration of colloidal suspensions. J Environ Eng. 2015;141(6):04014096(1-7).

Daufin et al., Cleaning of inorganic membranes after whey and milk ultrafiltration. Biotechnol Bioeng. Jun. 5, 1991;38(1):82-9.

Fischbein et al., Electron beam nanosculpting of suspended graphene sheets. Appl Phys Lett. 2008:93(11):113107(1-3). Epub Sep. 16, 2008.

Fissell et al., High-performance silicon nanopore hemofiltration membranes. J Memb Sci. Jan. 5, 2009;326(1):58-63. Epub Sep. 30, 2008.

Han et al., Photoluminescent arrays of nanopatterned monolayer $MoS_2$. Adv Funct Mater. Dec. 2017;27(45):1703688(1-12). Epub Oct. 13, 2017.

Jiang et al., Porous graphene as the ultimate membrane for gas separation. Nano Lett. Dec. 2009;9(12):4019-24. doi: 10.1021/nl9021946. Epub Sep. 23, 2009.

Kobayashi et al., Nitric acid oxidation of Si to form ultrathin silicon dioxide layers with a low leakage current density. J Appl Phys. Dec. 2003;94(11):7328-35. Epub Nov. 10, 2003.

Merchant et al., DNA translocation through graphene nanopores. Nano Lett. Aug. 11, 2010;10(8):2915-21. doi: 10.1021/nl101046t. Epub Jul. 23, 2010.

Mouri et al., Tunable photoluminescence of monolayer $MoS_2$ via chemical doping. Nano Lett. 2013;13(12):5944-8. doi: 10.1021/nl403036h. Epub Nov. 12, 2013.

Nan et al., Strong photoluminescence enhancement of MoS(2) through defect engineering and oxygen bonding. ACS Nano. Jun. 24, 2014;8(6):5738-45. doi: 10.1021/nn500532f. Epub May 16, 2014.

O'Hern et al., Selective ionic transport through tunable subnanometer pores in single-layer graphene membranes. Nano Lett. Mar. 12, 2014;14(3):1234-41. doi: 10.1021/nl404118f. Epub Feb. 3, 2014.

Oh et al., Photochemical reaction in monolayer MoS2 via correlated photoluminescence, raman spectroscopy, and atomic force microscopy. ACS Nano. May 24, 2016;10(5):5230-6. doi: 10.1021/acsnano.6b00895. Epub Apr. 25, 2016.

Patil et al., Ultra-high aspect ratio functional nanoporous silicon via nucleated catalysts. RSC Adv. 2017;7:11537-42. Epub Feb. 14, 2017.

Splendiani et al., Emerging photoluminescence in monolayer MoS2. Nano Lett. Apr. 14, 2010;10(4):1271-5. doi: 10.1021/nl903868w. Epub Mar. 15, 2010.

Wang et al., Large-area free-standing ultrathin single-crystal silicon as processable materials. Nano Lett. 2013;13(9):4393-8. Epub Jul. 22, 2013.

Wang et al., Creation of nanopores on graphene planes with MgO template for preparing high-performance supercapacitor electrodes. Nanoscale. Jun. 21, 2014;6(12):6577-84. doi: 10.1039/c4nr00538d.

Wei et al., Mo—O bond doping and related-defect assisted enhancement of photoluminescence in monolayer MoS2. AIP Advances. 2014;4:123004(1-7). Epub Oct. 6, 2014.

Wu et al., Layer thinning and etching of mechanically exfoliated MoS2 nanosheets by thermal annealing in air. Small. 2013;9(19):3314-3319.

Yamamoto et al., Anisotropic etching of atomically thin MoS2. J Phys Chem C. 2013;117:25643-9. Epub Nov. 12, 2013.

Ye et al., Defects engineered monolayer mos2 for improved hydrogen evolution reaction. Nano Lett. Feb. 10, 2016;16(2):1097-103. doi: 10.1021/acs.nanolett.5b04331. Epub Jan. 13, 2016.

(56) References Cited

OTHER PUBLICATIONS

Zeng et al., Fabrication of graphene nanomesh by using an anodic aluminum oxide membrane as a template. Adv Mater. Aug. 8, 2012;24(30):4138-42. doi: 10.1002/adma.201104281. Epub Mar. 21, 2012.

Zhou et al., Thickness-dependent patterning of MoS2 sheets with well-oriented triangular pits by heating in air. Nano Res. 2013;6(10):703-711.

Han et al., Nanoporous silicon-assisted patterning of monolayer $MoS_2$ with thermally controlled porosity: a scalable method for diverse applications. ACS Appl Nano Mater. 2018;1:3548-56. Epub Jun. 6, 2018.

Su et al., Ultrathin alumina mask-assisted nanopore patterning on monolayer MoS(2) for highly catalytic efficiency in hydrogen evolution reaction. ACS Appl Mater Interfaces. Mar. 7, 2018;10(9):8026-8035. doi: 10.1021/acsami.7b19197. Epub Feb. 20, 2018.

Wang et al., Shape evolution of monolayer MoS(2) crystals grown by chemical vapor deposition. Chem Mater. 2014;26:6371-6379. Epub Nov. 4, 2014.

U.S. Appl. No. 16/376,801, filed Apr. 5, 2019, Smith et al.

Invitation to Pay Additional Fees for Application No. PCT/US2019/026051 dated Jun. 7, 2019.

International Search Report and Written Opinion for Application No. PCT/US2019/026051 dated Aug. 2, 2019.

\* cited by examiner

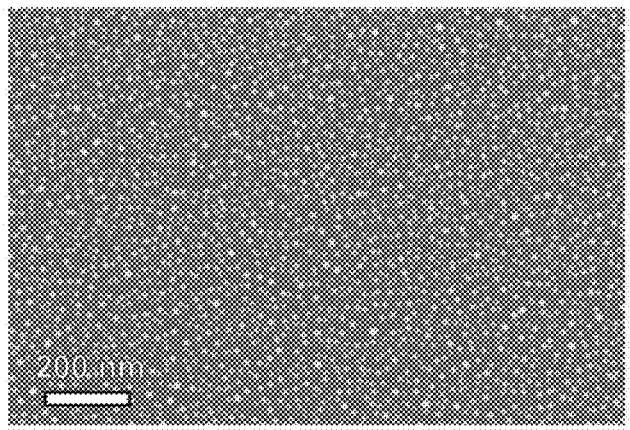
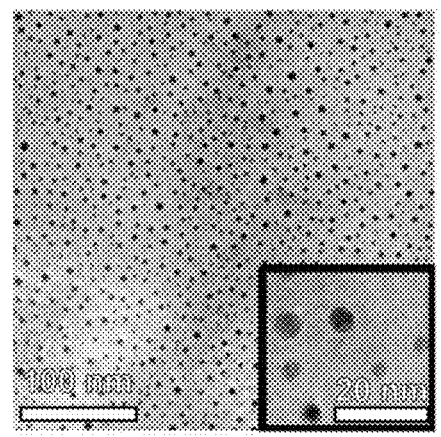
FIG. 8A  FIG. 8B
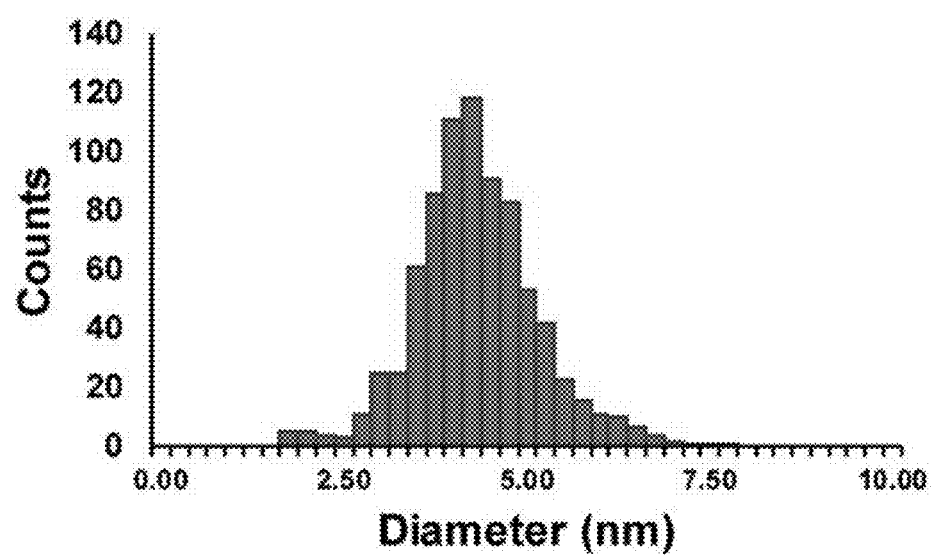
FIG. 8C

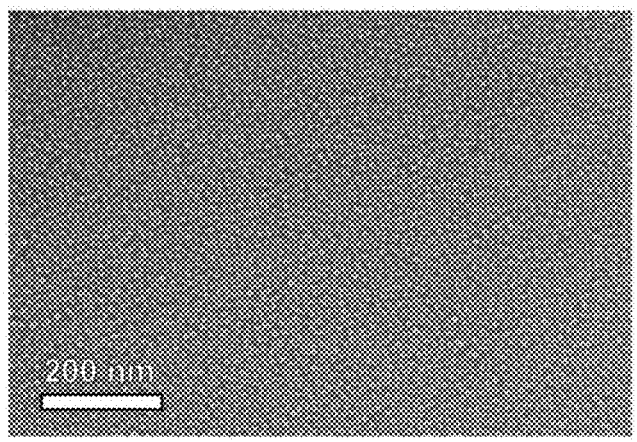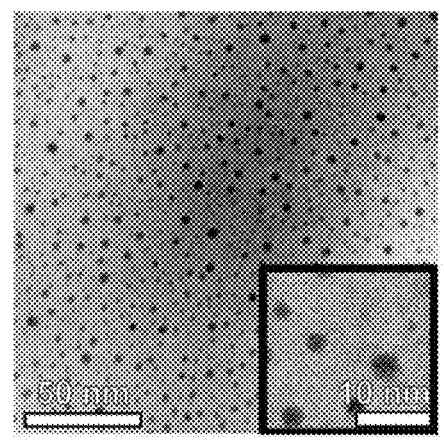
FIG. 9A          FIG. 9B
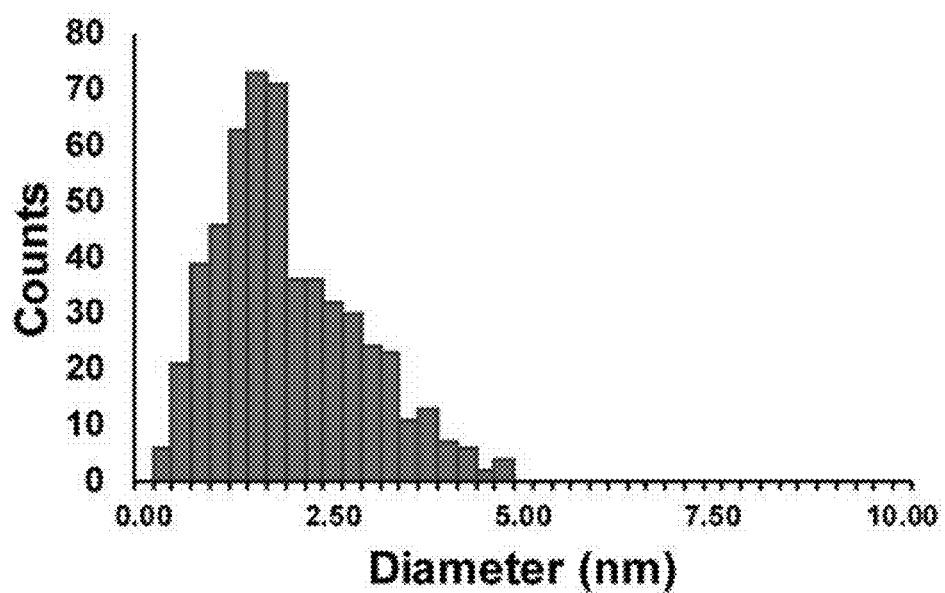
FIG. 9C

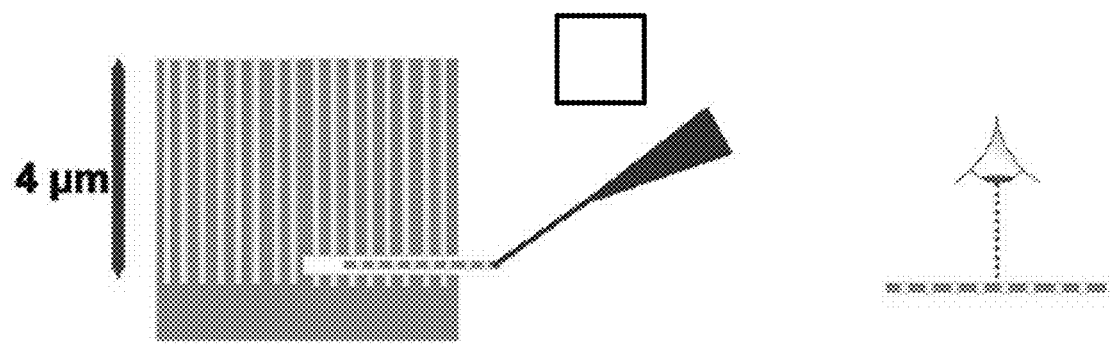
FIG. 12A          FIG. 12B
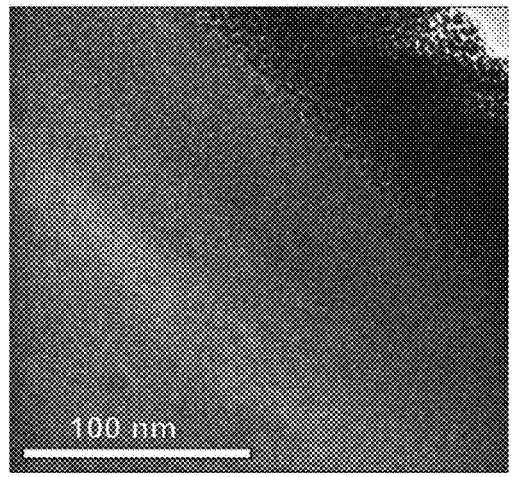 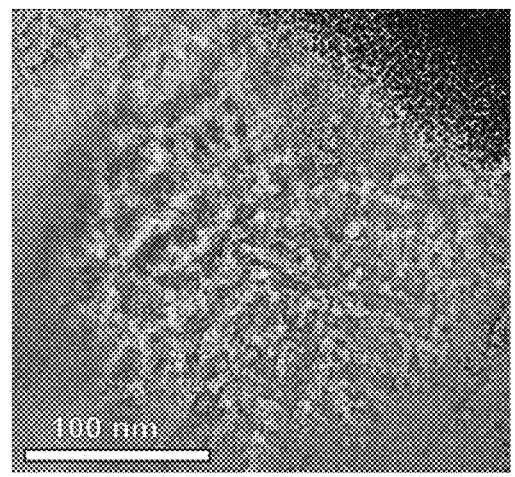
FIG. 12C          FIG. 12D

NANOPOROUS SEMICONDUCTOR MATERIALS

CROSS-REFERENCE TO RELATED APPLICATIONS

This application is a division of U.S. application Ser. No. 15/462,620, filed Mar. 17, 2017, entitled "NANOPOROUS SEMICONDUCTOR MATERIALS AND MANUFACTURE THEREOF", which claims the benefit under 35 U.S.C. § 119(e) of U.S. provisional application Ser. No. 62/310,474, filed on Mar. 18, 2016, each of which is hereby incorporated by reference in its entirety.

FIELD

Aspects described herein relate generally to nanoporous semiconductor materials and related methods.

BACKGROUND

The production of nanoporous semiconductor materials is important for many current and potential applications including nanofiltration, thermoelectrics, battery electrodes, photovoltaics, and catalysis. In each of these and other applications, nanoporous semiconductors having decreased pore sizes, decreased inter-pore spacing, and increased pore aspect ratios have been found to be advantageous. However, despite current advancements in nanofabrication technology, nanoporous semiconductor materials are nearing the limits of the accessible parameter space with respect to these design variables.

Accordingly improved methods are needed for producing nanoporous semiconductor materials.

SUMMARY

The current disclosure is related to the synthesis of nanoporous semiconductor materials. Certain embodiments are related to synthesis techniques utilizing metal-assisted chemical etching methods.

In one embodiment, a method for forming a nanoporous semiconductor material comprises positioning a plurality of nanoparticles proximate a semiconductor substrate. At least some of the nanoparticles of the plurality of the nanoparticles comprises a noble metal core and a sacrificial spacer layer surrounding the noble metal core. The method further comprises assembling at least a portion of the nanoparticles comprising a noble metal core and a sacrificial spacer layer surrounding the noble metal core into a close-packed array, removing at least a portion of the sacrificial spacer layer from at least some nanoparticles of the plurality of assembled nanoparticles to form a plurality of spaced noble metal nanoparticles, and forming a plurality of pores in the semiconductor material by etching the semiconductor surface at a location of at least a portion of the plurality of spaced noble metal nanoparticles.

In another embodiment, a method comprises removing at least a portion of a sacrificial material from a plurality of noble-metal containing nanoparticles positioned proximate a semiconductor substrate to form an array of a plurality of spaced noble metal-containing nanoparticles proximate the substrate, and etching the semiconductor surface proximate the array to form a nanoporous semiconductor material.

In a further embodiment, a nanoporous semiconductor material comprises a semiconductor material and a plurality of pores formed in the surface of the semiconductor material. The plurality of pores having an average pore diameter of less than 10 nm, and the plurality of pores define a total pore area that is greater than or equal to 10% of the surface area of the semiconductor material.

In yet another embodiment, a method comprises forming a plurality of noble metal islands proximate a semiconductor substrate, and forming a plurality of pores in the semiconductor material by etching the semiconductor surface at a location of at least a portion of the plurality of noble metal islands.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIG. 8A is a reproduction of an SEM image of sputtered Ag islands on a Si substrate, according to one example;

FIG. 8B is a reproduction of a TEM image of sputtered Ag islands on a Si substrate, according to one example;

FIG. 8C is a plot showing a histogram of Ag island sizes calculated from the TEM image of FIG. 8B;

FIG. 9A is a reproduction of an SEM image of sputtered Au islands on a Si substrate, according to one example;

FIG. 9B is a reproduction of a TEM image of sputtered Au islands on a Si substrate, according to one example;

FIG. 9C is a plot showing a histogram of Au island sizes calculated from the TEM image of FIG. 9B;

FIG. 12A is a schematic representation of a method for preparing a planar lamella of an NPSi sample, according to one example;

FIG. 12B is a schematic representation of the TEM perspective of a planar lamella, according to one example;

FIG. 12C is a reproduction of a TEM image of a planar lamella sample of native Si not exposed to a MACE process, according to one example;

FIG. 12D is a reproduction of a TEM image of a planar sample of NPSi etched with sputtered Au catalysts, according to one example;

DETAILED DESCRIPTION

Figure 1A:
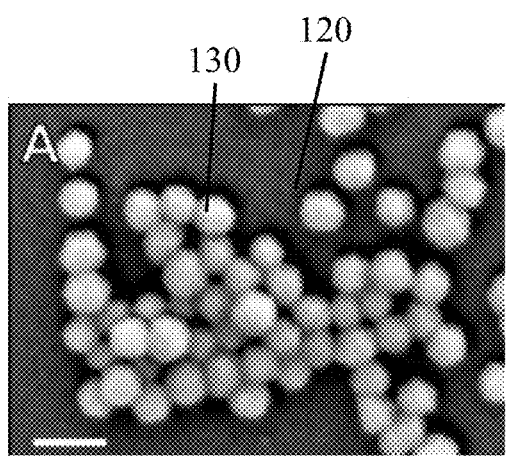
FIG. 1A is a reproduction of an SEM image of a crystalline Si substrate with drop-cast bare 50 nm gold nanoparticles before MACE.

The inventors have recognized and appreciated that current nanofabrication techniques are not always well suited for producing nanoporous semiconductor materials in a scalable manner while retaining the ability to finely control the morphology of the resulting nanoporous semiconductor material. For example, current state-of-the-art electron beam lithography coupled with deep reactive ion etching was recently demonstrated to be capable of fabricating nanobarrel structures with a wall thickness of 6.7 nm and aspect ratio of 50:1. While potentially viable for the fabrication of specific components in nanoelectronics, the extremely high costs and long processing times of electron beam lithography limits the technique to device sizes of square microns, and therefore it is not an appropriate technique for any of the above-mentioned applications which require larger device sizes. Block copolymer lithography has received significant attention as a more scalable alternative to electron beam lithography, and was recently utilized in conjunction with plasma etching to produce sub-10 nm features with aspect ratios of 17:1. However, both techniques still require bombardment of the substrate with ions in a vacuum, and consequently, they are intrinsically limited in their ability to be integrated into a high throughput manufacturing process such as that required for the previously mentioned applications.

Solution-based techniques have also been explored as alternatives to lithography-based techniques. For example, metal-assisted chemical etching (MACE) is an electrochemical technique that relies on noble metal-catalyzed anisotropic etching of nanopores in semiconductor materials via a simple, scalable, and low cost solution-based process. For example, the general reaction mechanism can be explained as follows for a gold catalyst deposited on the surface of a silicon (Si) substrate and placed in an aqueous solution of hydrofluoric acid (HF) and hydrogen peroxide ($H_2O_2$). $H_2O_2$ is first reduced at the nanoparticle surface in what constitutes the cathode reaction. Holes (h+) are generated in this reduction and diffuse from the particle to the Si substrate, which is subsequently oxidized and dissolved by the HF at the anode. The overall reaction also involves the reduction of protons (H+) into hydrogen, which is released as gas ($H_2$). As etching progresses, the gold nanoparticles maintain their proximity to the Si via van der Waals interactions, thus continuing to catalyze the reaction.

MACE has recently been the focus of a large body of work in which noble metal patterns are implemented in the etching of positive features such as nanowires, and negative features including nanopores. Common methods of forming negative nanopores via MACE include deposition of colloidal nanoparticle catalysts on a semiconductor surface, deposition and de-wetting of thin films, or growth from solution. Of these techniques, the deposition of pre-synthesized noble metal nanoparticles by drop-casting or similar methods affords the greatest degree of control over catalyst size, monodispersity, and position. While this process is intrinsically low cost and very scalable, the etching mobility of nanoparticles along crystallographic orientations is far more difficult to control than interconnected lithographically defined, sputtered, or grown patterns with interfaces planar to the substrates. This has been found to result in wandering of the particles laterally and partial loss of anisotropy, leading to significant variation in the pore depth and direction. Causes of this phenomenon may include the non-spherical nature of the particles, dislodging of the particles by the produced hydrogen gas, and non-homogenous injection of holes from the particles into the surrounding semiconductor material. This challenge is compounded for very small nanoparticles, as their shapes become dominated by faceting and no longer resemble spheres.

In view of the above, the inventors have recognized and appreciated numerous benefits associated with methods for producing nanoporous semiconductor materials that overcome the above-noted drawbacks associated with conventional lithographic and MACE techniques. For example, methods described herein may allow for the production of nanoporous semiconductor materials with smaller pore sizes, smaller inter-pore spacing, and larger pore aspect ratios compared to existing methods while also being scalable to larger areas and device sizes.

According to one embodiment of the invention, a method for producing a nanoporous semiconductor material includes positioning a plurality of nanoparticles onto the surface of a semiconductor substrate (e.g., by drop casting from a solution of nanoparticles) and allowing the nanoparticles to self-assemble into a close-packed monolayer array via solvent evaporation. Each of the nanoparticles includes a sacrificial spacer layer surrounding a smaller noble metal nanoparticle core. For example, in certain embodiments the noble metal nanoparticle core may include gold, silver, platinum, and/or palladium, and the sacrificial spacer layer may be an oxide such as silica ($SiO_2$). After the semiconductor material coated with a layer of nanoparticles, it is immersed in an etching solution (e.g., a MACE solution containing an acid such as hydrofluoric acid and an oxidizer such as hydrogen peroxide), and the sacrificial spacer layer is partially or fully removed, leaving behind a well-spaced array of noble metal nanoparticles (containing some residual, or no, sacrificial material) on the surface of the semiconductor. Accordingly, the sacrificial spacer layers maintain a minimum separation between the noble metal nanoparticles during deposition and self-assembly. The inventors have found that these spaced-apart noble metal nanoparticles may subsequently catalyze etching into the semiconductor surface to form nanopores with smaller diameters, smaller inter-pore spacing, and large pore aspect rations compared to those achievable with conventional solution-based etching techniques. Without wishing to be bound by any particular theory, the size of the etched pores and the inter-pore spacing may be controlled by the controlling the size of the catalytic noble metal nanoparticle, and thickness of the sacrificial spacer layer, respectively.

In certain embodiments, a method of forming a nanoporous semiconductor material includes positioning a plurality of noble-metal-containing nanoparticles are positioned proximate a semiconductor substrate. As used herein, the nanoparticles being positioned proximate the semiconductor substrate generally refers to the nanoparticles being positioned adjacent the surface of the semiconductor substrate, which may include a least a portion of the nanoparticles being in direct contact with the substrate. It should be understood that the plurality of noble-metal-containing nanoparticles may be positioned on the surface using any suitable method such as drop-casting, spin coating, self-assembled monolayer formation techniques such as a Langmuir-Blodgett trough, and so on.

As noted above, in some instances, a noble-metal-containing nanoparticle incudes a noble metal core that is at least partially surrounded by a sacrificial material (e.g., a sacrificial spacer layer). As used herein, a sacrificial material generally refers to a material that is intended to be at least partially removed before a semiconductor substrate is processed to form pores therein, and the sacrificial material may be removed by exposing the sacrificial material to an environment (e.g., a solvent) that dissolves the sacrificial material. For example, as noted above, in one embodiment a sacrificial material may include $SiO_2$, which can be rapidly dissolved via exposure to HF in a MACE solution. However, it should be understood that other sacrificial materials and/or solvents also may be suitable, as the current disclosure is not limited in this regard.

Depending on the particular embodiment, the noble-metal-containing nanoparticles may be nanostructures having any suitable shape, including, but not limited to, spheres, rods, wires, cubes, pyramids, prismatic shapes, and irregular shapes. Further, the noble metal core of a noble-metal-containing nanoparticle may have a shape that is generally the same as the overall shape of the nanoparticle, or the core may have a different shape than the nanoparticle. Accordingly, it should be understood that the current disclosure is not limited to any particular shape and/or configuration for a noble metal core and/or a noble-metal-containing nanoparticle.

In some embodiments, a plurality of noble-metal-containing nanoparticles may assemble into an array such as a close-packed array of nanoparticles. As used herein, an array generally refers to at least a partially ordered pattern, such as a two-dimensional pattern, in which at least a portion of the plurality of nanoparticles have a similar spacing relative to one-another. A close-packed array refers to an array in which at least a portion of the nanoparticles are in direct contact with two or more of their nearest-neighbor nanoparticles. For example, in a hexagonal close-packed array, each nanoparticle may be in direct contact with six nearest-neighbor nanoparticles. In some embodiments, the plurality of noble-metal-containing nanoparticles may be arranged in a close-packed array with the sacrificial material of adjacent nanoparticles in direct contact. After removal of the sacrificial material, the noble metal cores may be left in an array that is not close-packed (i.e., a spaced array). As noted above, the plurality of nanoparticles may self-assemble to form an array; i.e., the nanoparticles may naturally arrange themselves into an ordered pattern after being positioned proximate a semiconductor substrate. In some instances, the self-assembly may be driven by evaporation of a solvent, such as an aqueous solution in which the nanoparticles were dispersed.

According to another embodiment, a method for producing a nanoporous semiconductor material includes forming a plurality of noble metal islands on the surface of a semiconductor substrate. In some instances, forming the noble metal islands may include depositing a noble metal onto the semiconductor substrate via a suitable deposition process and allowing the islands to self-assemble as a result of the interfacial energy of the noble metal and the semiconductor substrate. In some instances, the self-assembly of the noble metal islands may result in homogenously sized and spaced islands. After formation of the noble metal islands, a plurality of pores is formed in the semiconductor substrate by etching (e.g., by immersing the semiconductor in a MACE solution). Similar to the embodiments discussed above, the inventors have recognized that the noble metal islands may catalyze the etching of the semiconductor surface to form nanopores with smaller diameters, smaller inter-pore spacing, and large pore aspect rations compared to those achievable with conventional solution-based etching techniques.

It should be understood that noble metal islands may form as a result of any suitable deposition process. For example, in some embodiments, a thin noble metal layer may be deposited by a physical vapor deposition process, such as a sputtering process (e.g., magnetron sputtering), electron beam assisted evaporation, or thermal evaporation. As noted above, the noble metal islands may form naturally as a result of the interfacial energy of the noble metal-semiconductor interface. Without wishing to be bound by any particular theory, in some embodiments, the size and spacing of the noble metal islands may be controlled by suitably controlling the surface energy of the semiconductor surface and/or one or more aspects of the deposition process, such as the amount of material deposited. Moreover, in some instances, a particular deposition process may result in a planar interface between the noble metal island catalysts and the semiconductor substrate surface, which may allow for highly anisotropic etching behavior, which may lead to higher aspect ratio pores.

As used herein, etching generally refers to chemically removing a portion of a (e.g., a semiconductor substrate) via exposure to an etching solution. In some embodiments, such as embodiments utilizing a MACE process, an etching process may be affected by the presence of a catalyst on the surface a substrate (e.g., a semiconductor substrate). Accordingly, methods in accordance with some embodiments may include etching the surface of a substrate in a pattern affected by an array of catalyst particles, such as an array of noble metal nanoparticles or noble metal islands formed after a deposition process (e.g., a sputtering process). In particular, the pattern of the features that are etched into the substrate may be determined, at least in part, by the positions of the catalyst particles in the array. Additionally, it should be understood that the current disclosure is not limited to any particular catalyst particle. For example, noble metal catalyst particles (e.g., nanoparticles and/or islands) are described above, and may include a noble metal such as gold, silver, platinum, palladium, etc. Moreover, in some embodiments, catalyst particles made from other metals such as copper also may be suitable.

In some embodiments, the methods described herein may be used to form nanoporous semiconductor materials having pore sizes and/or an inter-pore spacing of less than 15 nm, less than 10 nm, or less than 6 nm, and the aspect ratio of the pores may be greater than 50:1, greater than 75:1, greater than 100:1, greater than 200:1, greater than 300:1, or greater than 375:1, or greater than 400:1. In certain embodiments, the porosity of a nanoporous semiconductor material may be greater than 5%, greater than 10%, or greater than 15%. For example, in one embodiment, the porosity may be about 18%. As used herein, the porosity refers to the fraction of the total surface area of the semiconductor material that is covered with pores (i.e., the total area of the pores defined by the pores divided by the total surface area of the semiconductor substrate). Suitable semiconductor materials include, but are not limited to, silicon, gallium arsenide, indium phosphide, germanium, and silicon-germanium alloy; depending on the particular embodiment, a semiconductor material may be crystalline (i.e., single crystalline or polycrystalline).

Moreover, it should be understood that the current disclosure is not limited to any particular etching solutions. In some embodiments, MACE solutions containing a mixture of an acid (e.g., hydrofluoric acid, and an oxidizer may be suitable, and the particular acid and oxidizer may be selected based on the particular semiconductor material being etched. For instance, a mixture of hydrofluoric acid and hydrogen peroxide may be suitable for etching silicon, and a mixture of sulfuric acid and potassium permanganate may be suitable for etching gallium arsenide and indium phosphide.

Figure 16:
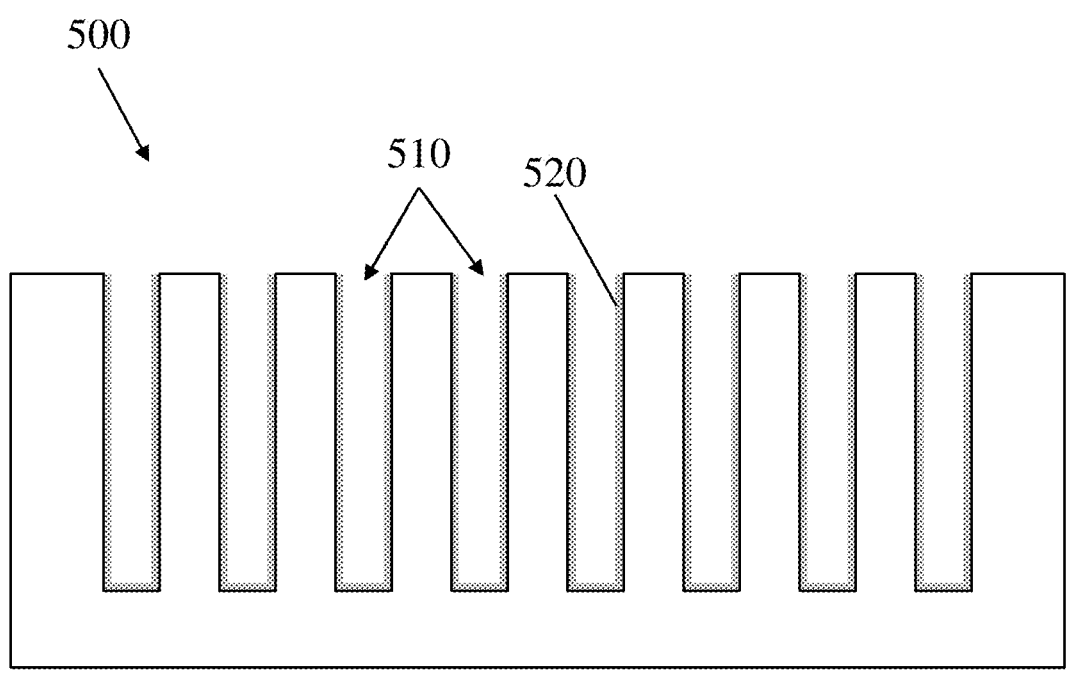
FIG. 16 is a schematic representation of a nanopourous semiconductor material including a functional layer, according to some embodiments.

In certain embodiments, the methods described herein may further comprise depositing a functional layer onto the surface of the pores of a nanoporous semiconductor material. For instance, the pore surfaces may be functionalized with an oxide material such as an aluminum oxide (e.g., $Al_2O_3$) or a titanium oxide (e.g., $TiO_2$), or other materials such as nitrides. For example, FIG. 16 depicts a schematic representation of one embodiment of a nanoporous semiconductor material 500 including a plurality of pores 510. The surface of each pore includes a functional layer 520. It should be understood that the functional layer may be deposited using any suitable deposition technique, including, but not limited to atomic layer deposition (ALD) and chemical vapor deposition (CVD).

EXAMPLES

The following examples are intended to illustrate certain embodiments of the present invention, but do not exemplify the full scope of the invention.

Example 1

Coated Nanoparticle Catalysts

In one set of illustrative examples, an entirely solution-based, modified MACE process is used to synthesize nanoporous silicon (NPSi) with sub-10 nm pore diameters, sub-10 nm inter-pore spacing, and pore aspect ratio of over 100:1. The method simultaneously allows for the fabrication of ordered nanopore arrays in a novel size regime, increases the etching homogeneity and anisotropy of nanoparticle catalyzed MACE, and drastically improves the scalability and high throughput nature of the process relative to conventional lithographic MACE approaches. As discussed in more detail below, the simple two-step process is carried out by first drop-casting silica-shell gold nanoparticles ($SiO_2$-AuNPs) onto a crystalline Si substrate. Solvent evaporation then facilitates $SiO_2$—AuNP self-assembly into close-packed monolayer arrays. Second, immersion of the $SiO_2$—AuNP monolayer coated Si into the MACE solution results in the rapid consumption of the silica shells by HF, leaving behind a well-spaced array of bare AuNPs on the surface. These AuNPs then seamlessly catalyze nanopore formation with an etching fidelity and consistency previously unobserved in the sub-10 nm regime. Through high resolution transmission electron microscopy (TEM) and scanning electron microscopy (SEM), the deposited $SiO_2$—AuNP monolayers and arrays of nanopores are characterized pre- and post-MACE respectively, allowing for the detailed monitoring of pore size, inter-pore spacing, and pore aspect ratio of the resulting NPSi.

$SiO_2$-AuNPs (5 nm and 10 nm gold cores) were purchased from Sigma-Aldrich USA. The 5 nm gold core particles are diluted twice with $H_2O$, followed by five times with acetone. The 10 nm gold core particles are diluted twice with acetone. Silicon wafers (Virginia Semiconductor Inc.) are boron-doped with resistivity 0.001-0.01 Ω·cm and thickness of 275 μm+/−25 μm. The prepared solutions are drop-cast onto a silicon wafer and allowed to dry in air. The coated substrate is then added to the MACE solution (5.65 M HF, 0.12 M $H_2O_2$) for varying times, as described in more detail below. The sample is removed and rinsed with DI water to stop the reaction. For imaging pore cross-sections, pores are filled with $Al_2O_3$ using atomic layer deposition (ALD, Cambridge NanoTech Savannah) for image contrast and conservation of the porous structure. Particle and pore sizes from SEM and TEM images are analyzed using ImageJ and MATLAB. Samples are imaged using a Zeiss Ultra Plus Field Emission SEM, FEI Helios 660 Focused Ion Beam (for cross-sectional milling) with SEM (with attached EDAX Energy Dispersive X-Ray Spectroscopy [EDS] Detector), and a JEOL 2100 Transmission Electron Microscope.

Figure 1B:
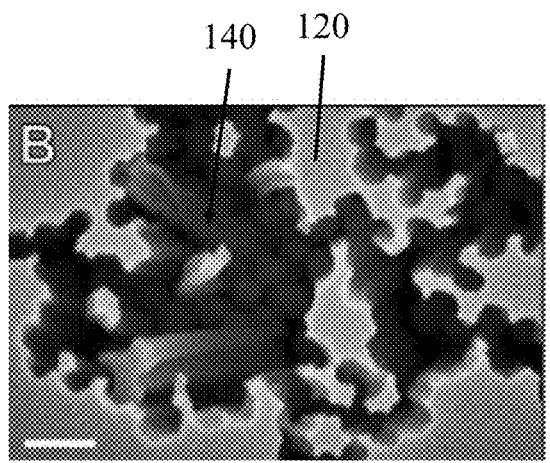
FIG. 1B is a reproduction of an SEM image of a Si substrate, similar to that shown in FIG. 1A, after MACE.
Figure 1C:
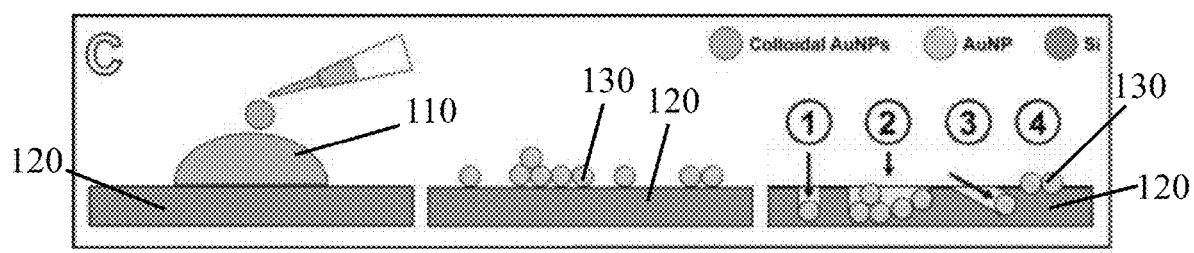
FIG. 1C is a schematic representation of a conventional MACE process.

As noted above, the use of noble metal nanoparticles deposited from solution to catalyze the etching of nanopores in Si via a conventional MACE process in Si offers the benefit of being a scalable route of manufacturing NPSi. FIG. 1C schematically illustrates the conventional MACE process, in which a solution 110 containing colloidal nanoparticles dispersed in a solvent is first deposited onto a silicon substrate 120. The solvent is allowed to evaporate leaving AuNPs 130 on the silicon substrate 120, and subsequently, the AuNPs catalyze etching. However, as illustrated in FIGS. 1A-1C, this method comes with its own set of challenges, primarily the control of the nanoparticle positioning on the surface, and subsequently ensuring that the particle etches in a direction normal to the substrate surface during the process. The former is made difficult by the numerous complex forces which govern the behavior of the nanoparticles both in solution and in the self-assembly process during solvent evaporation. These include van der Waals, electrostatic, steric, solvation, depletion, capillary, convective, and friction forces. The result of these interactions is that nanoparticles will often tend not to form monolayers of periodic spacing, but instead exhibit a clustering behavior. Such a phenomenon is demonstrated in FIGS. 1A-1B (scale bars are 100 nm). FIG. 1A shows the aggregation of bare 50 nm AuNPs 130 deposited via drop casting from solution onto a crystalline Si wafer 120. This behavior is particularly detrimental to the etching of nanopores via the MACE process. FIG. 1B shows an attempt at the etching of nanopores using a similarly aggregated group of bare 50 nm AuNPs; the aggregated groups of nanoparticles result in etching of relatively large, inhomogeneous pits 140. The result of this attempt is the etching of relatively large, inhomogeneous pits 130 in the Si (FIG. 1C-2), a morphology which is of little use to most relevant applications that require size-controlled individual pores. Other potentially undesirable results in conventional MACE process include the lateral etching of the nanocatalyst (FIG. 1C-3), or lack of etching altogether (FIG. 1C-4). AuNPs are understood to catalyze etching preferentially in the <100> direction, but can also deviate from this path due to the non-homogenous injection of holes from other surrounding catalysts and their own facets, or to dislodgement by the hydrogen gas produced during etching.

Figure 1D:
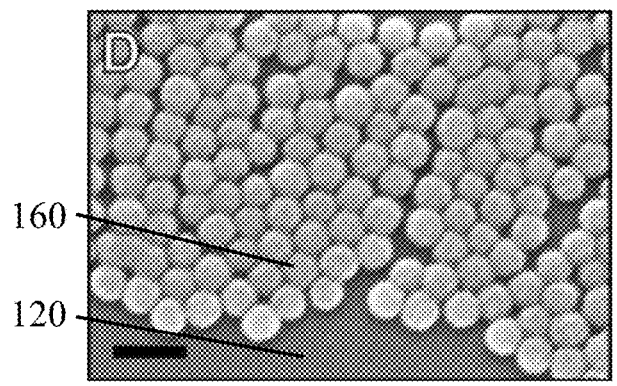
FIG. 1D is a reproduction of an SEM image of a crystalline Si substrate with drop-cast 10 nm core $SiO_2$-AuNPs before MACE, according to one example.
Figure 1E:
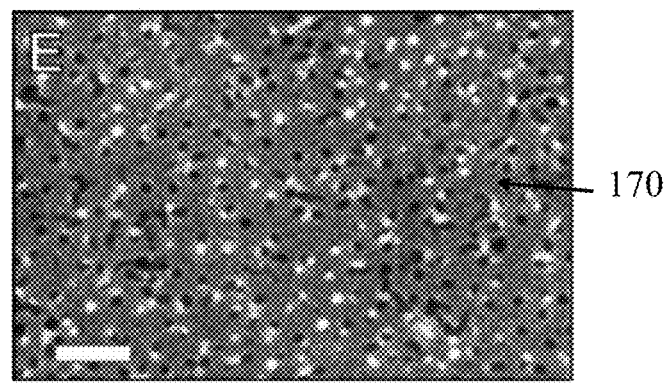
FIG. 1E is a reproduction of an SEM image of a crystalline Si substrate, similar to that of FIG. 1D, after MACE, showing a nanoporous Si material according to one example.
Figure 1F:
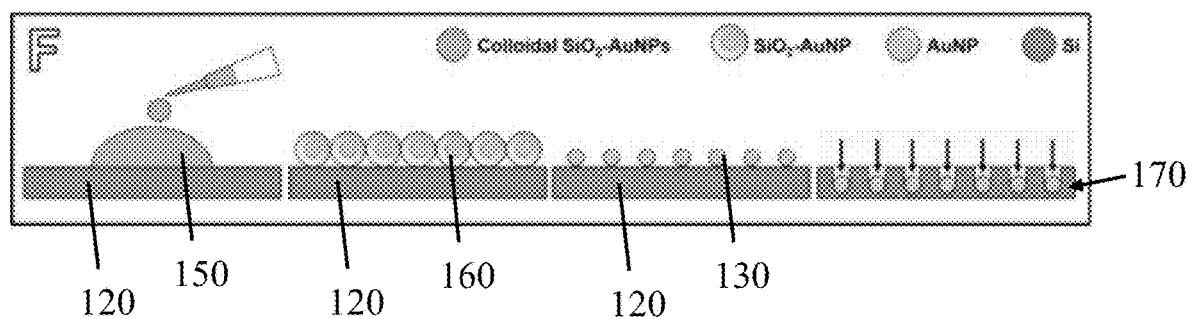
FIG. 1F is a schematic representation of a modified MACE process according to some embodiments.

In contrast, a modified MACE process in accordance with the current disclosure, which involves the self-assembly of SiO2-AuNPs monolayer arrays from solution on a crystalline Si substrate, is illustrated in FIGS. 1D-1F. The overall process is shown schematically, in FIG. 1F. A solution 150 containing colloidal $SiO_2$-AuNPs 160 is drop cast onto a silicon substrate 120. The SiO2 serves as a sacrificial spacer layer, which acts to maintain separation between the AuNP cores during deposition and self-assembly, and as shown in FIGS. 1D and 1F, the $SiO_2$-AuNPs 160 assemble into a well-spaced array after solvent evaporation. Upon immersion into the MACE etchant, the $SiO_2$ shell is rapidly consumed, leaving behind periodically spaced AuNPs 130 which begin the etching process to form the NPSi material 170. FIG. 1D depicts a monolayer of $SiO_2$-AuNPs with 10 nm gold cores and $SiO_2$ shells of 15-20 nm thickness, while FIG. 1E displays an etched Si substrate, i.e., a NPSi material 170, which was initially coated in a similar monolayer, following one hour of exposure to the MACE solution. The scale bars in FIGS. 1D-1E are 100 nm.

Figure 2A:
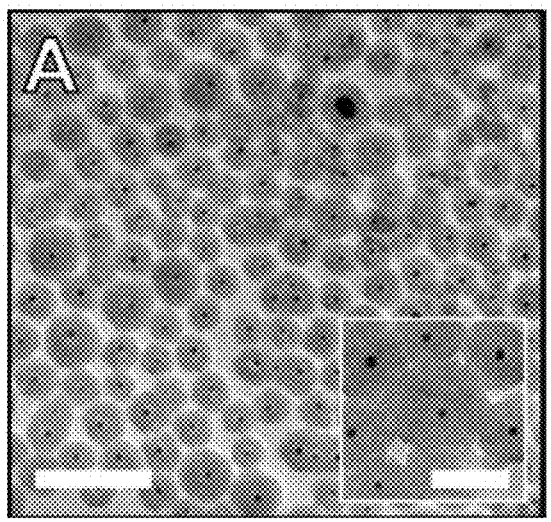
FIG. 2A is a reproduction of a TEM image of 5 nm $SiO_2$-AuNPs drop cast on a Si substrate according to one example.
Figure 2B:
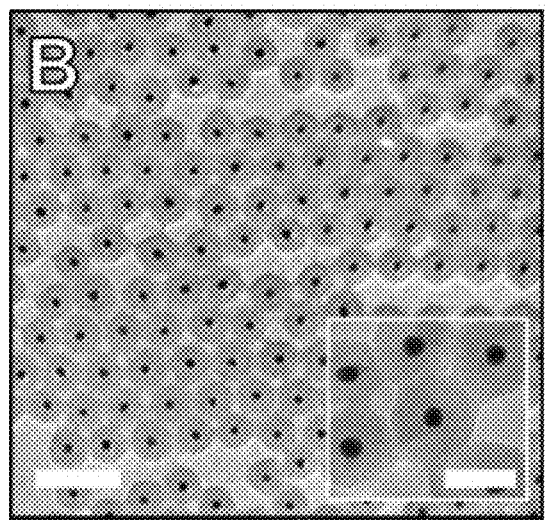
FIG. 2B is a reproduction of a TEM image of 10 nm $SiO_2$-AuNPs drop cast on a Si substrate according to one example.
Figure 2C:
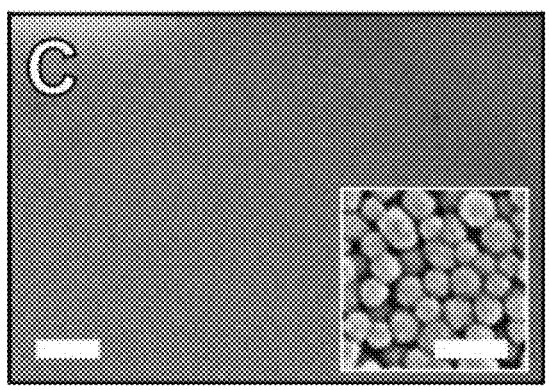
FIG. 2C is a reproduction of an SEM image of 5 nm $SiO_2$-AuNPs drop cast on a Si substrate according to one example.
Figure 2D:
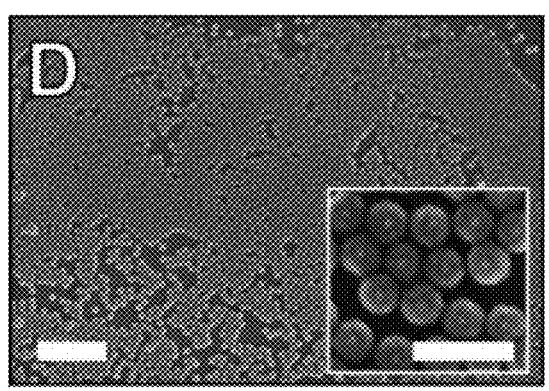
FIG. 2D is a reproduction of an SEM image of 10 nm $SiO_2$-AuNPs drop cast on a Si substrate according to one example.

$SiO_2$-AuNPs can be synthesized in a simple solution chemistry process using tetraethylorthosilicate (TEOS) as a precursor with the ability to precisely control shell thickness ranging from 2-90 nm. In this example, 5 nm and 10 nm diameter gold core $SiO_2$-AuNPs ($SiO_2$ shells thicknesses of 15-20 nm) are used in order to explore a new pore size regime in NPSi as well as to achieve a fine degree of pore size and inter-pore spacing control. FIGS. 2A and 2B display TEM images of 5 nm and 10 nm $SiO_2$-AuNPs, respectively, drop-cast from aqueous solutions of acetone and ultrapure water onto (100) Si wafers; the scale bars are 100 nm, and the inset scale bars are 40 nm for each of FIGS. 2A and 2B. Analysis by TEM (FIGS. 2A, 2B) shows both the outer SiO2 shells and the well-spaced inner gold cores. Some regions of monolayer exhibit a well-ordered hexagonal close packed pattern, while others are slightly more spaced. Also observable are areas of sparse bilayer formation above the more closely packed monolayers (FIG. 2A). The behavior of these partial bilayers during MACE is discussed in more detail below in the context of porosity, inter-pore spacing, and process control. FIGS. 2C and 2D show lower magnification SEM images of similar 5 nm and 10 nm $SiO_2$—AuNP arrays over multiple microns, elucidating the facile scalability of catalyst deposition. The scale bars are 1 μm in FIG. 2C and 500 nm in FIG. 2D, and the inset scale bars the inset scale bars are 100 nm. Though further exploration and optimization of different deposition techniques such as slope assembly need to be carried out in order to achieve centimeter scale arrays of $SiO_2$—AuNP catalysts, there is no fundamental barrier to their realization.

Figure 3A:
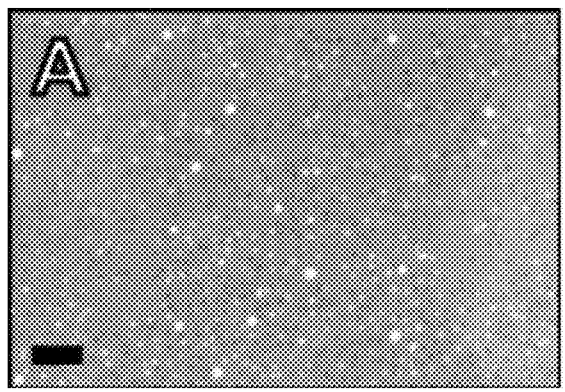
FIG. 3A is a reproduction of an SEM image of drop-cast 5 nm $SiO_2$-AuNPs catalyzing MACE for 15 minutes according to one example.
Figure 3B:
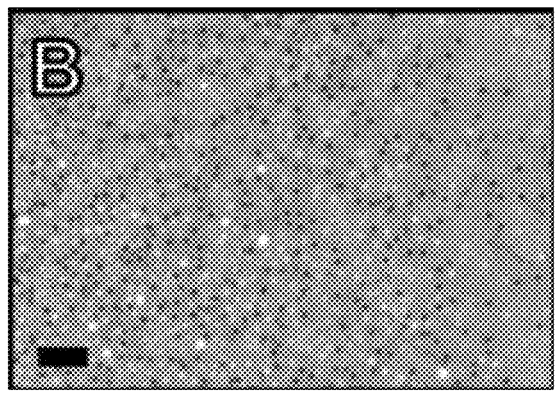
FIG. 3B is a reproduction of an SEM image of drop-cast 5 nm $SiO_2$-AuNPs catalyzing MACE for 30 minutes according to one example.
Figure 3C:
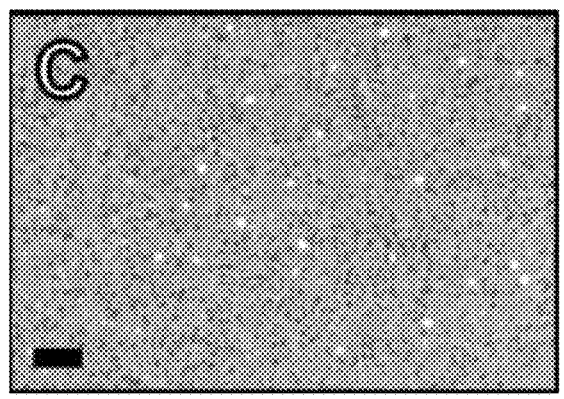
FIG. 3C is a reproduction of an SEM image of drop-cast 5 nm SiO$_2$-AuNPs catalyzing MACE for 60 minutes according to one example.
Figure 3D:
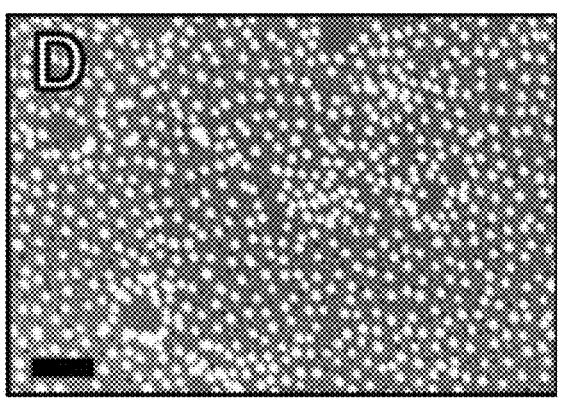
FIG. 3D is a reproduction of an SEM image of drop-cast 10 nm SiO$_2$-AuNPs catalyzing MACE for 15 minutes according to one example.
Figure 3E:
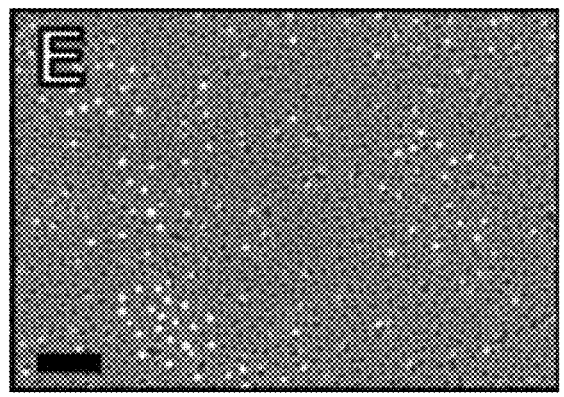
FIG. 3E is a reproduction of an SEM image of drop-cast 10 nm SiO$_2$-AuNPs catalyzing MACE for 30 minutes according to one example.
Figure 3F:
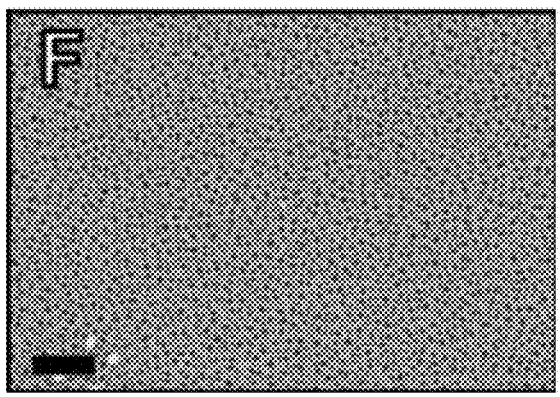
FIG. 3F is a reproduction of an SEM image of drop-cast 10 nm SiO$_2$-AuNPs catalyzing MACE for 60 minutes according to one example.

To demonstrate the time-based progression of the modified MACE process, drop-cast samples were exposed to the etchant solution for 15, 30, and 60 minutes. In particular, FIGS. 3A-3C show SEM for 5 nm gold core particles after 15, 30, and 60 minutes, respectively. Similarly, FIGS. 3D-3F show SEM images for the 10 nm gold core particles after 15, 30, and 60 minutes, respectively. The scale bars in each of the FIGS. 3A-3F are 100 nm. The images in FIG. 3 show progression of the MACE process after dissolution of SiO2 shells. For both particle sizes (5 nm gold core and 10 nm gold core), the SiO$_2$ shells should dissolve almost immediately after introduction to the MACE solution, leaving homogenously spaced arrays of bare AuNPs. Many 5 nm core-particles are observed to begin etching into the Si within 15 minutes (FIG. 3A), while few 10 nm core-particles demonstrate etching within the same time interval (FIG. 3D). After 60 minutes, most of the particles have etched into the Si and are no longer visible on the surface for both 5 nm and 10 nm samples. Even though ideally, all particles should etch into Si once their SiO$_2$ shells are dissolved, there are two possible reasons as to why this may not occur: (1) Once a particles' shell has etched, it may make contact with the Si surface either on a facet vertex or an edge of one of its crystal grains. Since hole injection rate from a single particle is directly proportional to its contact surface area with the Si, its etching rate would be drastically lower than a particle with a planar interface between its facet and the Si surface. (2) Depending on the distribution of SiO$_2$ shell thicknesses of particles, some particles may start etching before their neighbors in close proximity, which may cause a small number of particles to stay on the surface due to the lack of hole injection in the near vicinity from surrounding particles which have already penetrated the substrate.

Since directional etching is promoted by uniform hole injection into the Si, particles lacking adjacent neighboring particles are less likely to etch downwards, or at all. A promising observation is that little to no lateral or cluster etching has taken place after 60 minutes, possibly explained by the high degree of uniformity in hole injection from the closely spaced AuNPs which seems to promote anisotropic etching in the <100> direction. As a result, the inventors concluded that the quality of NPSi depends primarily on the quality and monodispersity of the SiO$_2$-AuNPs being MACE processed, as well as the quality of the self-assembled monolayer (SAM) produced.

Figure 4A:
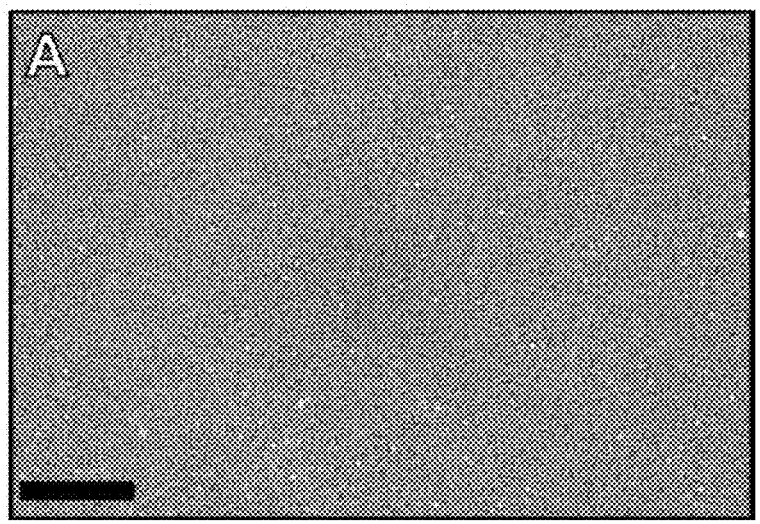
FIG. 4A is a reproduction of an SEM image of NPSi produced via 60 minutes of modified mace using drop-cast 5 nm SiO$_2$-AuNPs according to one example.
Figure 4B:
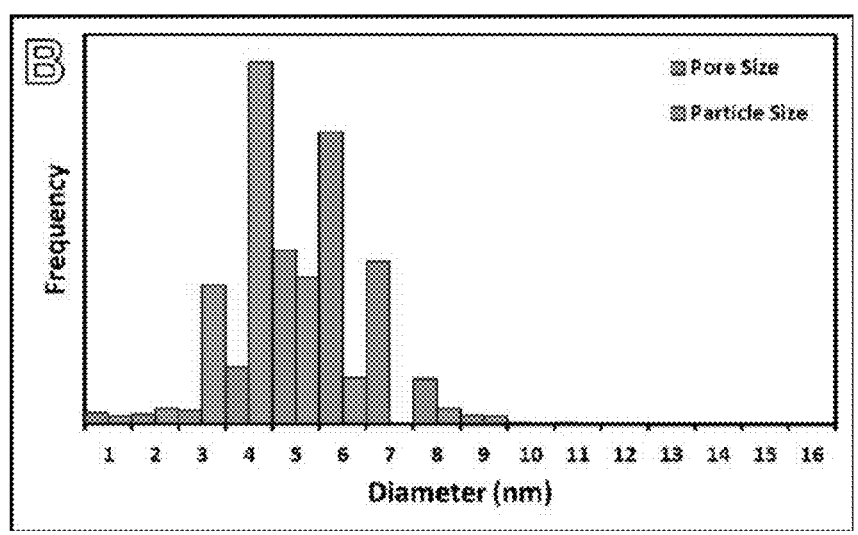
FIG. 4B is a histogram of Au core and pore size distributions for the NPSi material show in FIG. 4A.
Figure 4C:
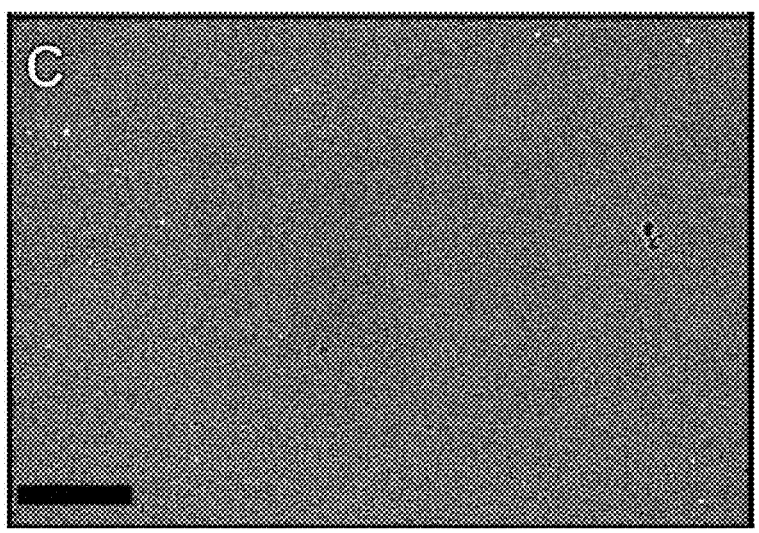
FIG. 4C is a reproduction of an SEM image of NPSi produced via 60 minutes of modified mace using drop-cast 10 nm SiO$_2$-AuNPs according to one example.
Figure 4D:
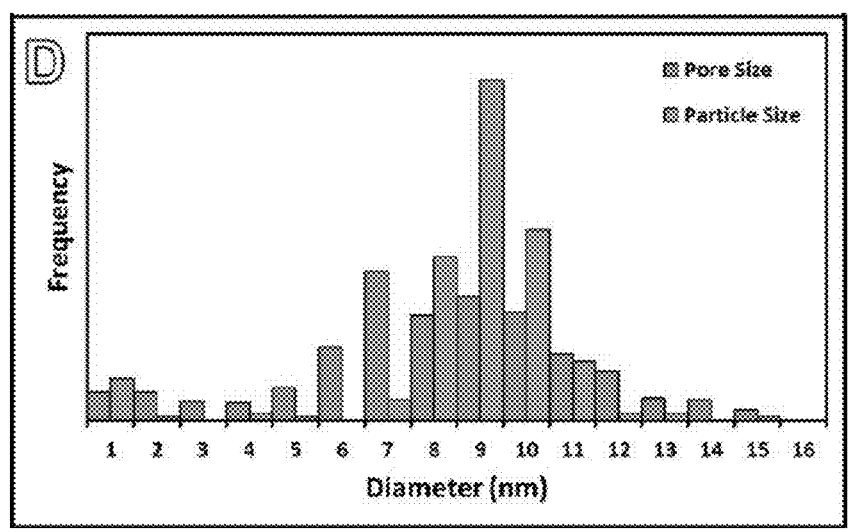
FIG. 4D is a histogram of Au core and pore size distributions for the NPSi material shown in FIG. 4C.

To quantitatively elucidate the morphology of the fabricated NPSi, NPSi materials produced via a 60 minute modified MACE process were analyzed on various length scales to obtain information on pore size and inter-pore spacing by statistical analysis. FIGS. 4A and 4C depict SEM images of the NPSi material produced via 60 minutes of the modified MACE process using drop-cast 5 nm and 10 nm SiO2-AuNPs, respectively (scale bars are 500 nm). FIGS. 4B and 4D show histograms of the Au core (particle) and pore size distributions for the 5 nm and 10 nm SiO2-AuNPs, respectively. The commercially purchased stock 5 nm SiO$_2$-AuNPs particles were found to have a mean gold core diameter of 4 nm+/−1 nm, while the NPSi produced by the modified MACE method according to the current disclosure exhibited a resulting mean pore diameter of 6 nm+/−1 nm, and a porosity of 12.5%+/−1% (across three different samples) after MACE. Commercially purchased stock 10 nm SiO$_2$-AuNPs had a mean diameter of 9 nm+/−2 nm, and were shown to produce a mean pore size of 8 nm+/−3 nm and a porosity of 18.0%+/−3% (across three different samples) in the MACE process. Some of the discrepancy between gold core size and final pore size can be attributed to pore deformation occurring as a result of SEM imaging, likely a result of the high-voltage electron beam effects on the Si. In addition, gold core size and pore size were characterized by TEM and SEM respectively, which could also contribute to observed disagreement for the 10 nm sample. This approach is necessitated by the extreme difficulty of TEM sample preparation for the post-MACE high-porosity nanoporous silicon. Data from over 1000 pores and 400 particles are used for analysis. Similar results are observed over several microns of substrate, and the consistency of etching and coverage is solely limited by the SiO$_2$—AuNP monolayer quality and coverage. Even if particles are not assembled in ideal monolayers, the SiO$_2$ spacer ensures a minimum spacing of $$\left(\frac{\sqrt{3}}{4}d_t - d_{AuNP}\right)$$

where $d_t$ is the particle diameter including the gold core and silica shell, and $d_{AuNp}$ is the gold core diameter for up to a trilayer of SiO$_2$-AuNPs. The deposition of more than a monolayer does, however, result in a less controllable process by decreasing inter-pore spacing and increasing porosity unpredictably. As such, the ability to obtain large area monolayer arrays of SiO$_2$-AuNPs on the Si surface is crucial for a successful result. Both the sub-10 nm pore sizes and >12% porosities achieved here represent advances over previous ground breaking work by Gaborski et al. that showed NPSi with 10-40 nm pore sizes and 1.44% porosity.

Figure 5A:
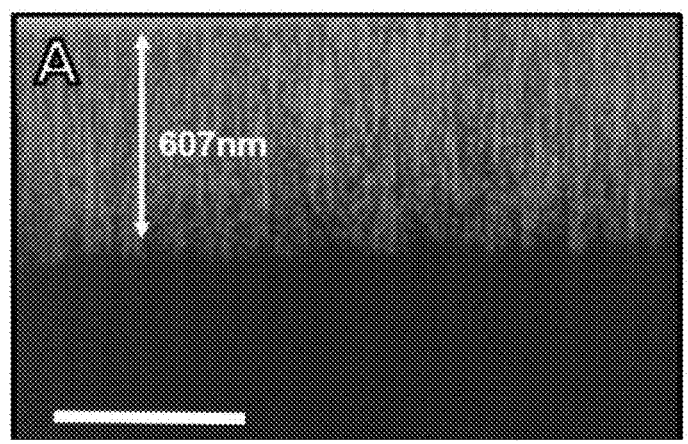
FIG. 5A is a reproduction of an SEM cross-sectional image of FIB milled NPSi produced via a modified MACE process with 5 nm SiO$_2$-AuNPs according to one example.
Figure 5B:
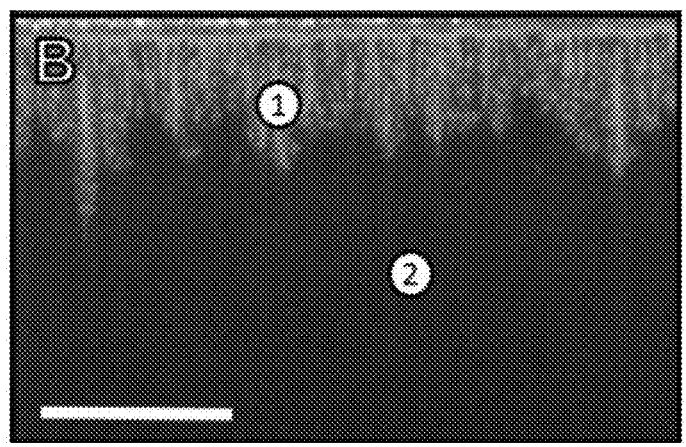
FIG. 5B is a reproduction of an SEM cross-sectional image of FIB milled NPSi produced via a modified MACE process with 10 nm SiO$_2$-AuNPs according to one example.
Figure 5C:
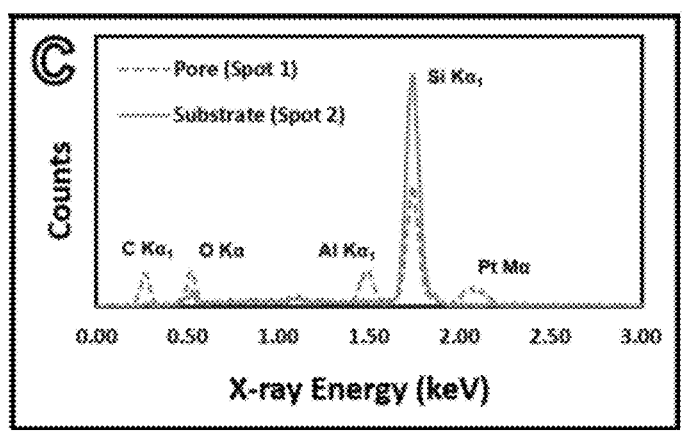
FIG. 5C is a graph showing EDS analysis of the SEM image of FIG. 5B.
Figure 6A:
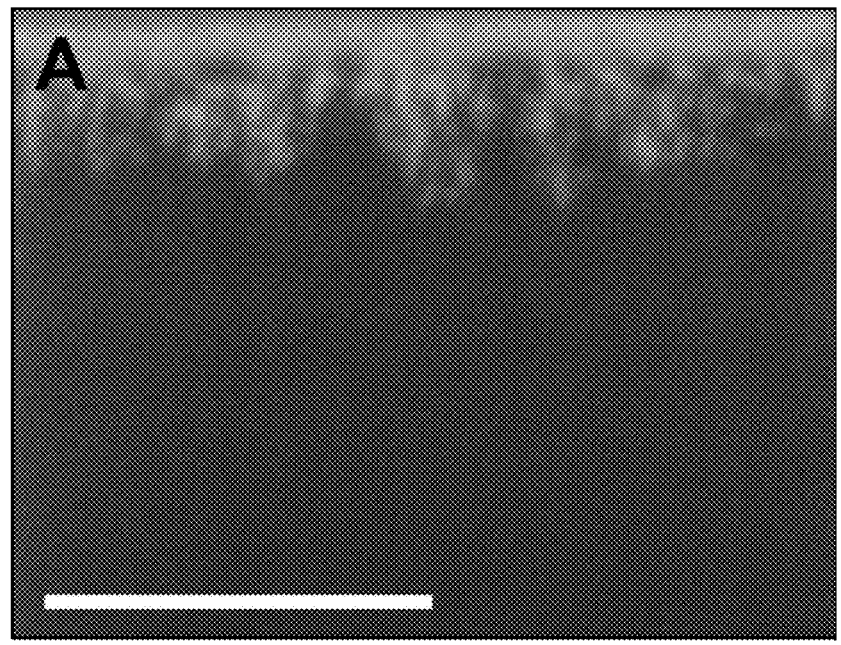
FIG. 6A is a reproduction of an SEM cross-sectional image of FIB milled NPSi produced via a modified MACE process with 5 nm SiO$_2$-AuNPs and an etching time of 30 minutes, according to one example.
Figure 6B:
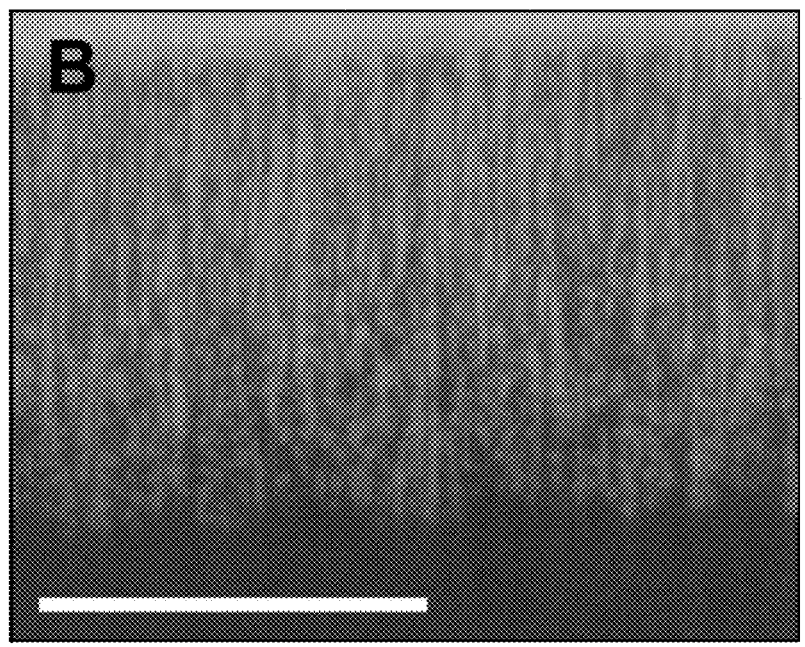
FIG. 6B is a reproduction of an SEM cross-sectional image of FIB milled NPSi produced via a modified MACE process with 5 nm SiO$_2$-AuNPs and an etching time of 60 minutes, according to one example.

In addition to pore size and inter-pore spacing, pore depth and aspect ratio are essential metrics for the application of NPSi in membranes and thin films. This was investigated following MACE processing by filling the resulting NPSi pores with aluminum oxide (Al$_2$O$_3$) using atomic layer deposition (ALD). ALD was used for the dual purpose of: (1) preserving the nanoporous structure and (2) enhancing the image contrast of pores against the Si matrix during cross-sectional milling and SEM imaging respectively. Cross-sections were milled from 60 minute MACE samples using focused ion beam milling (FIB) and were then imaged by SEM. FIGS. 5A-5B show SEM cross-sectional images of FIG milled NPSi produced via the modified MACE process with drop-cast 5 nm (FIG. 5A) and 10 nm (FIG. 5B) SiO$_2$-AuNPs (scale bars are 500 nm). The cross-sections were analyzed within (spot 1) and below (spot 2) the porous area using energy dispersive x-ray spectroscopy (EDS) as shown in FIG. 5C. The highly conformal nature of the ALD growth and its ability to fill narrow, high aspect ratio structures allows for an accurate representation of the NPSi cross-section. Pore filling was verified using EDS analysis within the pore area to show presence of Al and O within bright regions (e.g. Spot 1), and absence of these elements in dark regions (e.g. Spot 2) (FIGS. 5B-5C). EDS analysis revealed pore depths of over 500 nm for NPSi produced with both 5 nm (FIG. 5A) and 10 nm (FIG. 5B) SiO$_2$-AuNPs, yielding aspect ratios of over 100:1 for the 5 nm NPSi when coupled with the pore size data (FIG. 4B). Such aspect ratios have not been previously demonstrated in MACE produced NPSi, with the best recent result being the fabrication of nano-trenches with aspect ratios of 65:1. A possible explanation for this result is the close proximity and consistent spacing of the catalytic AuNPs, which results in uniform hole injection across the entire substrate, yielding excellent anisotropy and producing high aspect ratio pores. Further support for this is provided by the observation that 10 nm SiO$_2$—AuNP catalysts produced shallower nanopores than their 5 nm counterparts after an identical etching time (FIGS. 5A-5B). Close observation of the inter-pore spacing for the 5 nm and 10 nm samples reveals more tightly packed pores in the 5 nm case. It is likely that the closer proximity of gold particles allowed for more homogenous hole injection, and therefore a greater etching rate, resulting in deeper pores. To characterize the etching rate over time, cross-sectional samples of NPSi etched with 5 nm SiO$_2$—AuNP catalysts were imaged after 30 and 60 minutes. As shown in FIG. 6A, after 30 minutes of etching, pore depth reached approximately 200 nm, while 60 minutes of etching produced pores approximately 600 nm in depth, as shown in FIG. 6B (the scale bars in FIGS. 6A-6B are 500 nm). The slower rate over the first 30 minutes of etching may be a result of the time required for the consumption of the silica shell and the initiation of etching. Therefore, a more accurate etch rate is obtained by considering the final 30 minutes of etching, during which pores are produced in a direction normal to the surface at a rate of approximately 13 nm/minute. This rate is not expected to be constant for increased etching times, due to the diffusion-limited nature of the etching process.

Figure 7A:
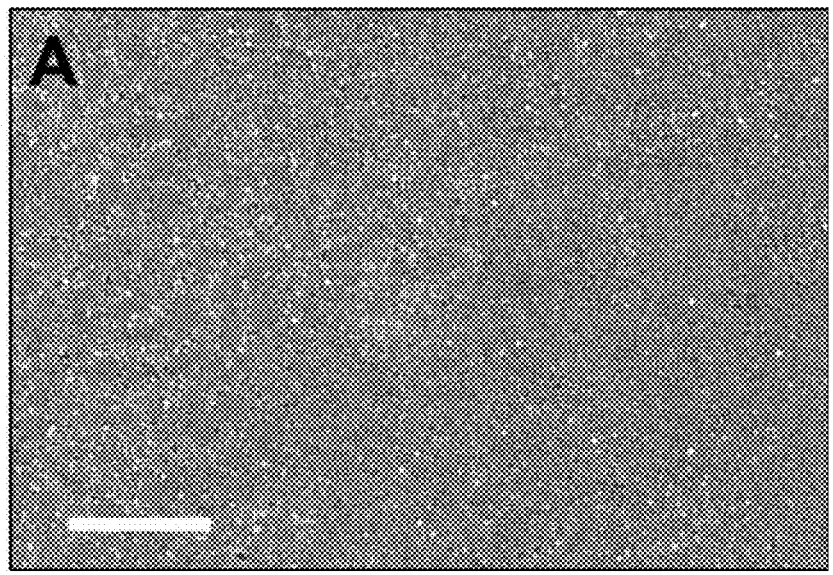
FIG. 7A is a reproduction of an SEM image of an NPSi sample produced via a modified MACE process with drop-cast 5 nm SiO$_2$-AuNPs and an etching times of 30 minutes, immediately after etching, according to one example.
Figure 7B:
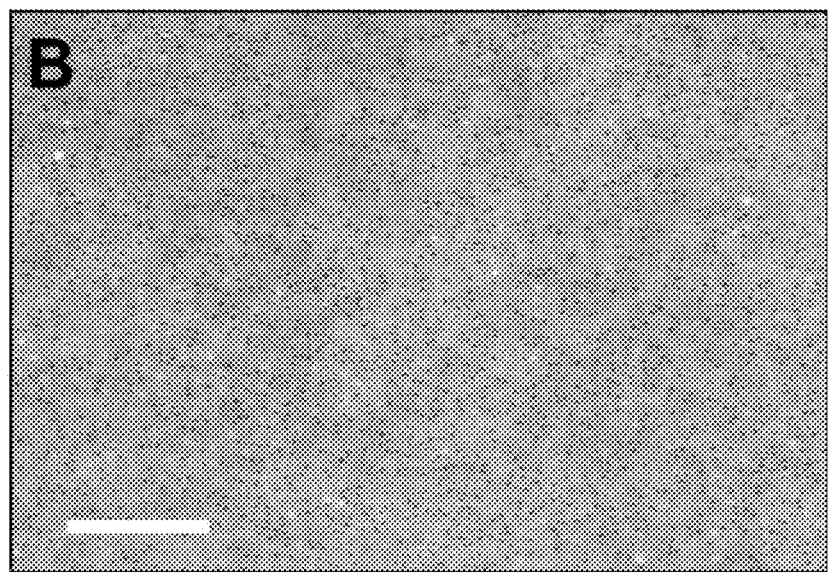
FIG. 7B is a reproduction of an SEM image of the NPSi sample of FIG. 7A after allowing the sample to sit in air for two months.

A final important property of merit for the produced NPSi is chemical and physical stability. The demonstrated ability to deposit ultra-stable materials such as Al$_2$O$_3$ onto the high aspect ratio pore walls of the produced NPSi (FIG. 5) shows that the material can be optimized both for many different applications and for maximum chemical stability. The physical stability of the NPSi was investigated by comparing images of a just-produced sample with one stored in air for two months. In particular, FIGS. 7A-7B show SEM images of NPSi produced via the modified MACE process with drop-cast 5 nm SiO$_2$-AuNPs and etching times of 30 minutes. Imaging was performed immediately after the etching process (FIG. 7A), and following a time period of two months during which the sample sat in air (FIG. 7B); the scale bars are 500 nm. The morphological similarity between the two samples demonstrates the structural stability of the material over time.

Example 2

Noble Metal Island Catalysts

In another set of illustrative examples, a modified MACE process is used to produce NPSi with sub-10 nm pore sizes and pore aspect ratios as high as 400:1. As discussed in more detail below, the method leverages the nucleation of sputtered noble metals on a silicon surface to form noble metal islands, which catalyze the etching process to form the high aspect-ratio pores. After etching, the porous structure is characterized with scanning electron microscopy (SEM) and transmission electron microscopy (TEM), as well as vertical and horizontal focused ion beam (FIB) cross-sectional milling at a depth of several microns within the silicon substrate. Moreover, as explained in more detail below, the NPSi is functionalized with Al$_2$O$_3$ and TiO$_2$ via atomic layer deposition (ALD). TiO$_2$-functionalized NPSi exhibits reflectivity of 6-8% for visible wavelengths, and 2-3% in the infrared—showing its promise as a robust and functional porous substrate. The developed approach of employing MACE with sputtered nucleated catalysts facilitates the scalable fabrication of functional ultra-high aspect ratio nanopores in silicon.

Moreover, using the deposition of nucleated noble metal islands to catalyze the etching of nanopores via a MCE process offers the benefit of forming homogenous arrays of pores without the need to carefully control the parameters of the wet chemical processes associated with monolayer formation, as may be required for nanoparticle catalysts. Instead, the deposited noble metal may naturally form highly ordered arrays of homogeneously sized and spaced catalysts. In this manner, the methods described herein may allow for a simple two-step MACE process for producing NPSi. Further, this method is capable of forming NPSi without any intrinsic limitations on scaling to form nanoporous structures over large areas.

(100) Silicon wafers (B-doped, thickness: 275±25 µm, resistivity: 0.001-0.01 Ω·cm) were solvent cleaned using a standard Acetone—IPA—DI Water rinse. The dried wafers were sputtered with AJA ATC 2200 UHV Sputter Coater under pre-deposition pressure of 5-10×10$^{-8}$ Pa, Ar flow of 40 sccm, and deposition pressure of 4 mTorr. The targets were DC magnetron sputtered at 125 W. The deposition rates were 3.2 Å/s for gold (Au) and 4.0 Å/s for silver (Ag). Following deposition of the noble metals, and the subsequent formation of islands of the deposited noble metals, the substrates were placed into the MACE solution (5.33 M HF, 0.12 M H$_2$O$_2$) to etch the substrate and form the NPSi. The reaction was terminated by washing with water and removal of substrates, followed by drying with a N$_2$ gun.

For functionalized samples, the NPSi was coated using a benchtop ALD system. In the case of alumina-functionalized samples, Al$_2$O$_3$ was coated via a static-flow process at 200° C.; the precursors were trimethylaluminum and H$_2$O, with calculated a growth rate of 1.14 Å/cycle. In the case of titania-functionalized samples, TiO$_2$ was coated via a static process at 190° C.; the precursors were tetrakis(dimethylamido)titanium and H$_2$O with a calculated growth rate of 0.45 Å/cycle.

The process of sputtering nominally thin-films of metal causes the nucleation of homogenously spaced and sized islands. The size and morphology of islands is influenced by surface defects on the substrate and the interfacial energies of the metals with Si, where the metal surface energies (γ) are $\gamma_{Ag}$=1.246–1.250 J m$^{-2}$, and $\gamma_{Au}$=1.500–1.506 J m$^{-2}$. Due to their wetting behavior on the native oxide surface, Au and Ag films nucleate as isolated islands instead of a continuous film.

FIGS. 8-9 show SEM and TEM images of nucleated islands resulting from sputtering 3 Å of Au and Ag, along with corresponding histograms of island size. In particular, FIGS. 8A and 8B show SEM and TEM images, respectively, of sputtered nucleated Ag islands, and a histogram of the Ag island sizes is shown in FIG. 8C. Similarly, FIGS. 9A and 9B show SEM and TEM images, respectively, of Au islands, and a histogram of the Au island sizes is shown in FIG. 9C. Observed diameters of nucleated islands are 4.4±0.9 nm for Ag (FIGS. 8A-C) and 2.0±0.9 nm for Au (FIGS. 9A-C). The SEM images demonstrate the large-area coverage of the Au and Ag islands over the silicon substrate. This island formation is homogeneous over the entire sputtered and etched region of the silicon wafer. TEM images show the Volmer-Weber film nuclei. The advantages to this method over using conventional nanoparticle deposition or in situ nanoparticle growth are superior substrate-metal interface contact area, smaller particle size, narrower particle size distribution, and uniform catalyst spacing over large areas.

Figure 10A:
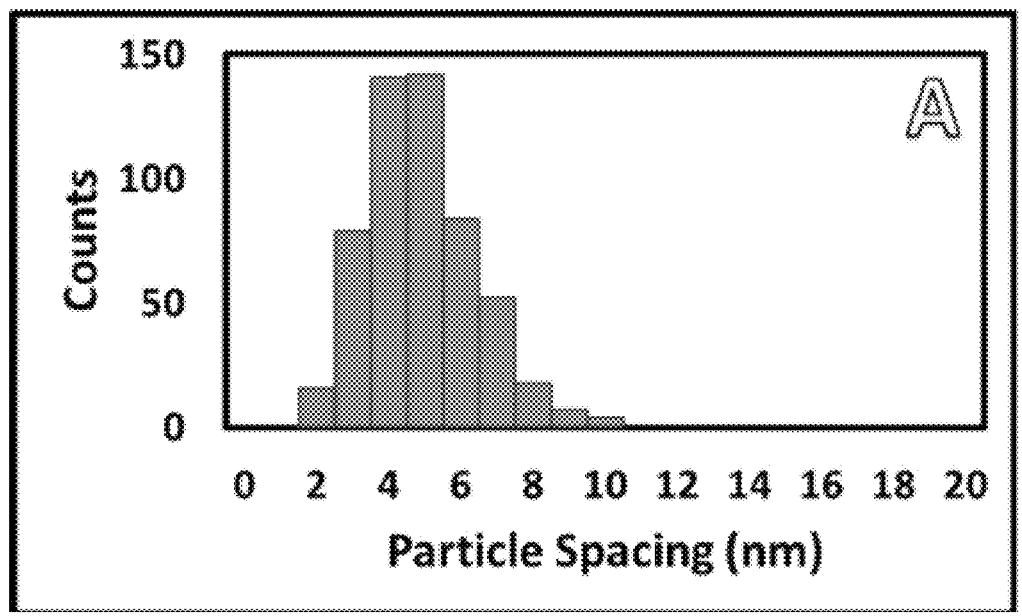
FIG. 10A is a plot showing a histogram of the spacing between the Ag islands calculated from the TEM image of FIG. 8B.
Figure 10B:
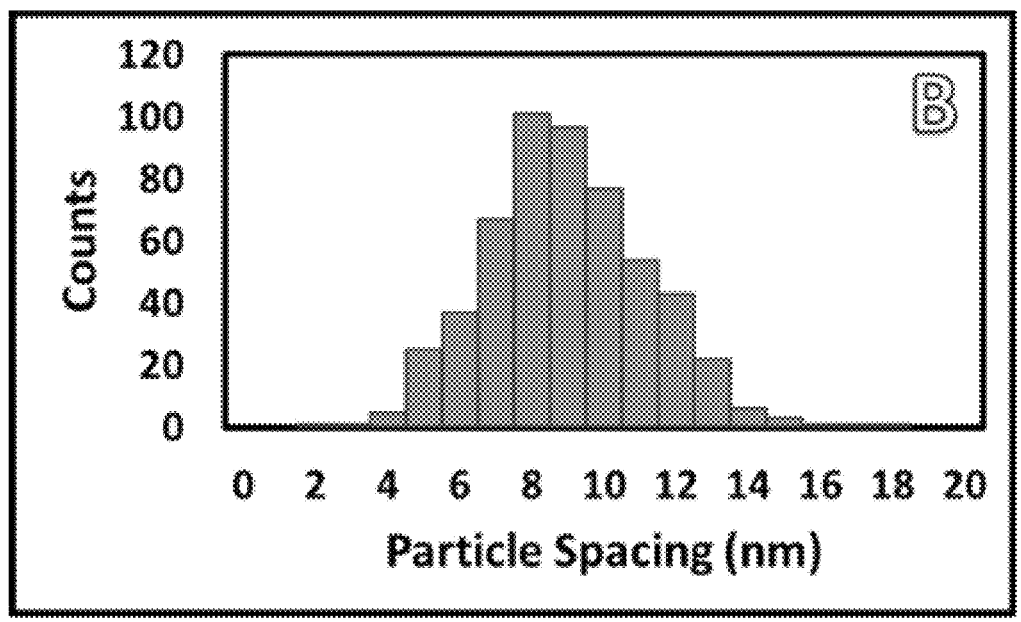
FIG. 10B is a plot showing a histogram of the spacing between the Au islands calculated form the TEM image of FIG. 9B.

FIGS. 10A-B show histograms of the island spacing for the Au and Ag samples, respectively; the histograms are calculated from the TEM images shown in FIGS. 8B and 9B, respectively. The spacing is defined as the separation distance between the center of one island and the center of its closest neighboring island.

Following sputter deposition, the wafer is placed in the MACE etchant solution. Etching of silicon is enabled by localized silicon oxidation, facilitated via catalytic reduction of $H_2O_2$ on noble metal nanoparticles. This is followed by etching of $SiO_2$ by HF, allowing the metalislands to continue etching normal to the Si surface. In some instances, after etching, the nanopores of the NPSi are filled with $Al_2O_3$ via ALD to enhance imaging contrast and to preserve the porous morphology prior to characterization.

Figure 11A:
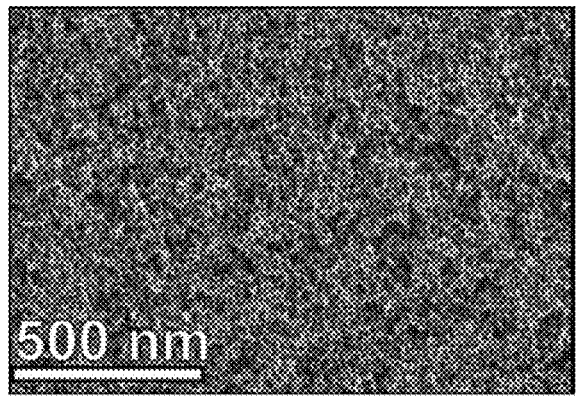
FIG. 11A is a reproduction of an SEM image of NPSi etched with sputtered Au island catalysts, according to one example.
Figure 11B:
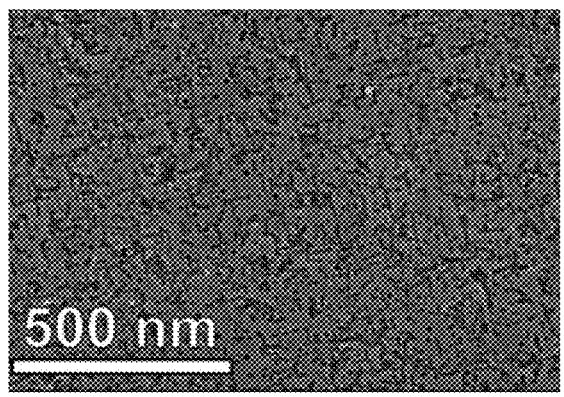
FIG. 11B is a reproduction of an SEM image of NPSi etched with sputtered Ag island catalysts, according to one example.
Figure 11C:
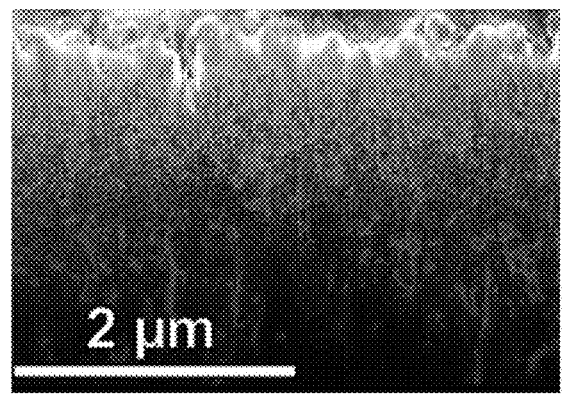
FIG. 11C is a reproduction of an SEM cross-sectional image of NPSi etched with sputtered Au island catalysts, according to one example.
Figure 11D:
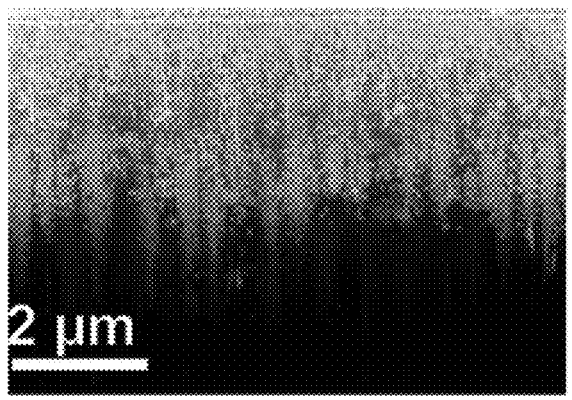
FIG. 11D is a reproduction of an SEM cross-sectional image of NPSi etched with sputtered Ag island catalysts, according to one example.

In some cases, a further degree of control over island size could be employed via silicon surface treatment prior to catalyst nucleation. Removal of native oxide with HF prior to noble metal deposition increases wettability of the films. This in turn is expected to cause a lower metal island contact angle, but also higher likelihood of silicide formation. The effect of contact angle on etching characteristics can be elucidated by comparing the etching behavior of Au and Ag metal islands, which exhibit different wetting behavior. With its lower surface energy, Ag has a higher contact angle with Si than does Au, thus forming more pronounced islands, as seen in the SEM images shown in FIGS. 8A and 8D. This, in turn, leads to more lateral etching on the surface prior to etching in the <100> direction. This is observed as linear tracks surrounding pores as shown in FIG. 11B, which is an SEM image of a porous Si surface etched with Ag. In contrast Au has a lower contact angle, and does not exhibit the same degree of lateral etching as evidenced by FIG. 11A, which is an SEM image of a porous Si surface etched with Au. FIGS. 11C and 11D show SEM images of focused ion beam (FIB) milled cross-sections for the Au and Ag etched NPSi samples, respectively, with a 1 hour etch time. The pores were back filled with $Al_2O_3$ via ALD prior to FIB milling.

To verify the presence of nanopores and examine the morphology within the bulk of the sample following etching, TEM images of horizontal cross-sections (i.e., planar lamellae) of NPSi and a control Si sample prepared via FIB at a depth of 4 μm are compared. A schematic representation of the process for preparing the planar lamellae is shown in FIGS. 12A-B. In particular, FIG. 12A illustrates removal of a lamella from an NPSi sample via an Omniprobe, and FIG. 12B illustrates the TEM viewing perspective. FIG. 12C shows a TEM image of a lamella of a native Si sample not exposed to the MACE process, and FIG. 12D shows a TEM image of a lamella of a sample sputtered with a gold catalyst and immersed in the MACE solution for one hour. The darker contrast area in the top right corner of FIGS. 12C and 12D is due to a platinum protective layer deposited prior to planar sectioning. The TEM image shown in FIG. 12D demonstrates the presence of pores at depths beyond 4 μm into the substrate for the sample etched with sputtered Au. The ability to extract a 100 nm lamella at a 4 mm depth while maintaining the porous morphology also demonstrates the structural stability of the porous structure.

Figure 13:
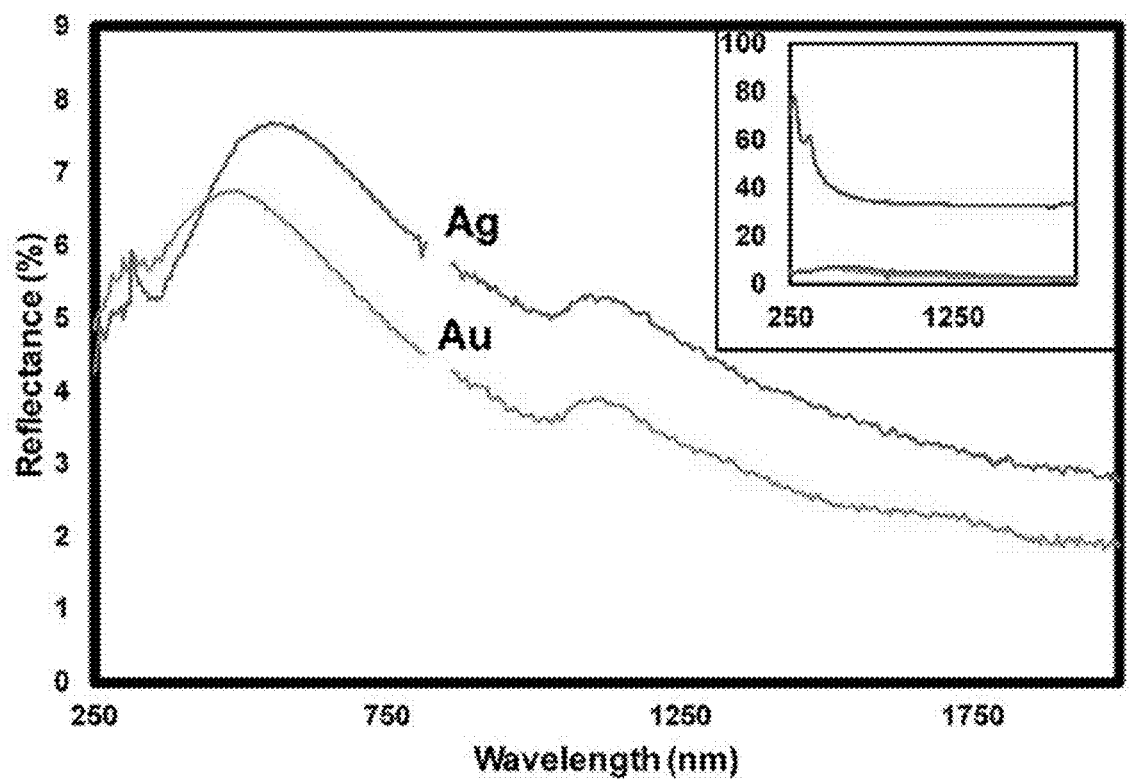
FIG. 13 is a plot showing the reflectance spectra for NPSi etched with sputtered Au and Ag catalysts and coated with TiO$_2$, according to one example.

In addition to the deposition of $Al_2O_3$, ALD is utilized here for the conformal coating of the NPSi pore walls with TiO2. This process yields a porous, high surface-area functional substrate, while its porosity results in antireflective properties. Nanostructured TiO2 has been explored for applications owing to its anti-reflective and self-cleaning properties. FIG. 13 shows reflectivity measurements for TiO2-functionalized NPSi, demonstrating reflectance values between 2% and 8% over the UV-visible and short-IR wavelengths for both Au— and Ag-etched Si. The NPSi produced here demonstrates promise due to its small pore sizes, and high aspect ratios; with these metrics, higher pore densities can be achieved, which correlate to higher functional surface area. Thus, these results demonstrate NPSi functionalized with a deposited nanometer-thick layer of TiO2, with the potential of being a material with competitive light absorption and conversion properties.

Figure 14A:
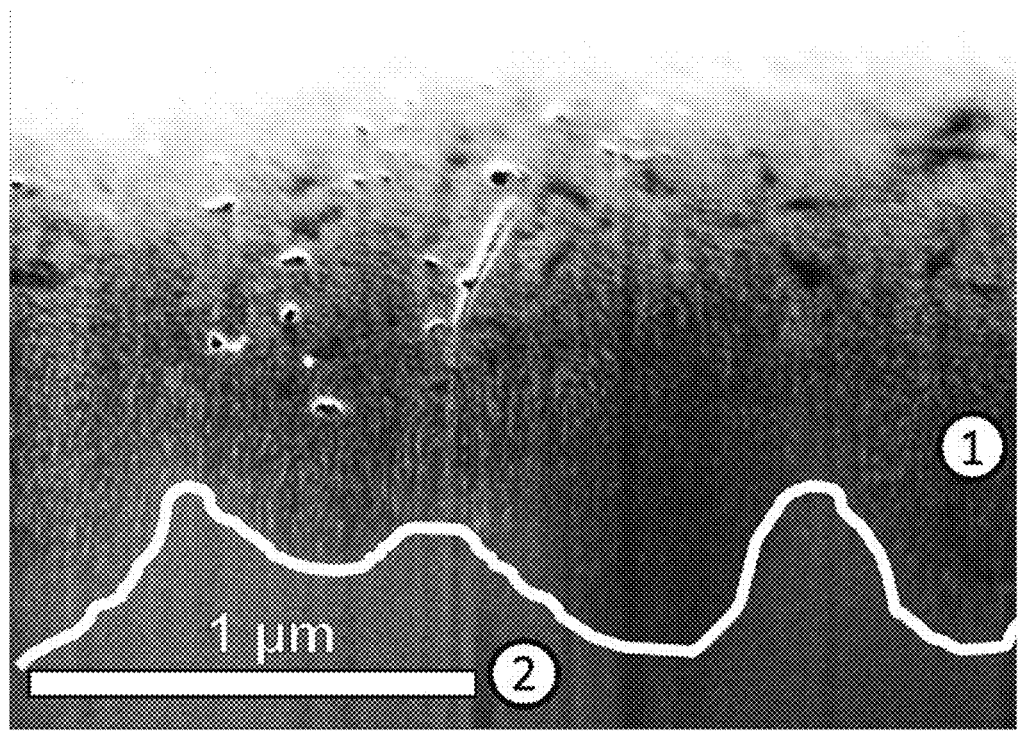
FIG. 14A is a reproduction of an SEM cross-sectional image of NPSi etched with sputtered Au islands and coated with TiO$_2$, according to one example.
Figure 14B:
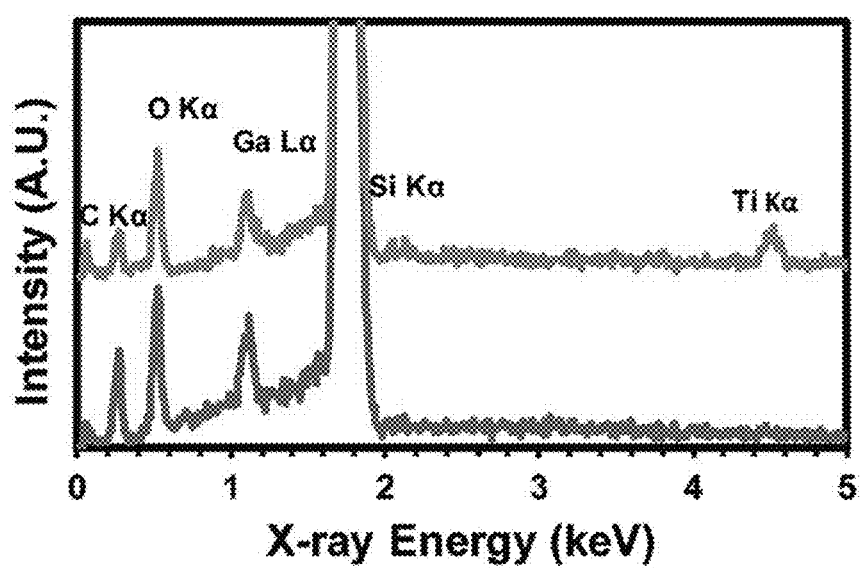
FIG. 14B is a plot showing the EDS spectra of the SEM image of FIG. 14A at two different spots, according to one example.

Turning now to FIG. 14A, an SEM image is shown for a FIB milled cross-section of a $TiO_2$ functionalized NPSi sample that was etched with Au. The $TiO_2$-filled pore area is lighter in comparison to the silicon background. The white line illustrates the lowest visible pore depth along the cross-section. FIG. 14B shows an EDS analysis of the SEM region shown in FIG. 14A for two different spots, labeled 1 and 2 in FIG. 14A. Spot 1 is at a depth of 700 nm below the surface and shows the presence of $TiO_2$, while spot 2 is at a depth of 1300 nm below the surface and does not show $TiO_2$. The Si peak is cut off due to the strong signal from the underlying substrate. These results confirm conformal $TiO_2$ deposition into high aspect ratio pores to depths of roughly 1 μm below the substrate surface. Ti and O are both present above the dotted line (700 nm, EDS point 1) (FIG. 12B). The pores shown in FIG. 14A are fully filled with TiO2 for characterization, but can also be partially filled to maintain the nanoporous structure of the substrate. EDS point 2, at 1300 nm, shows no Ti presence. C and Ga are present due to the substrate and surface contamination and ion implantation, respectively. The lack of a Ti signal indicates the absence of the porous regime.

Figure 15:
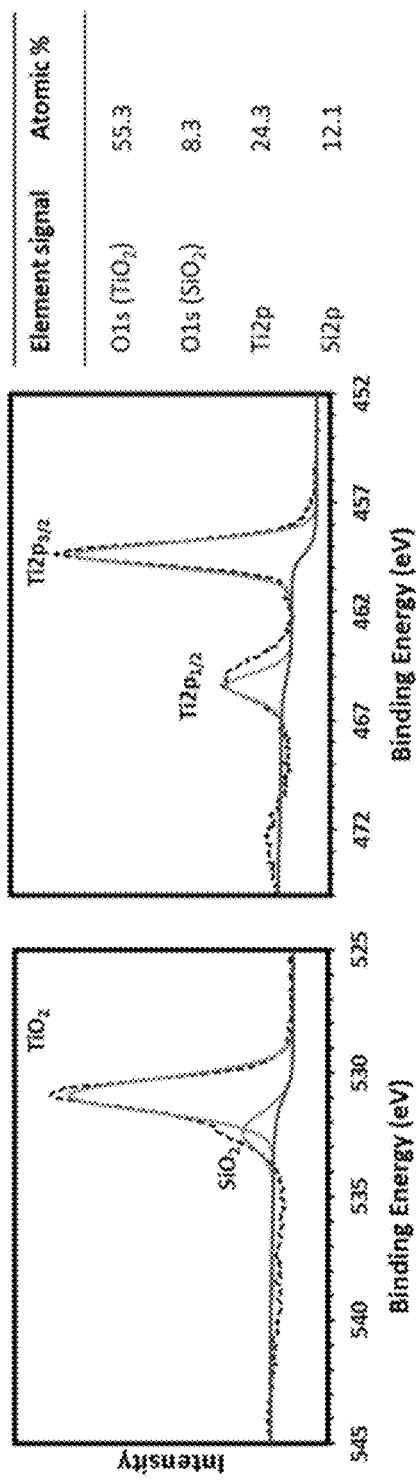
FIG. 15 shows plots of an XPS analysis of ALD-coated NPSi, according to one example.

The coated NPSi surface was characterized via XPS to confirm the composition of the ALD coating. FIG. 15 shows high resolution XPS scans of O and Ti from ALD-processed NPSi. The O1 signal is deconvoluted to separate peaks associated with $SiO_2$ and $TiO_2$ oxygen signals. These high resolution element scans confirm the stoichiometry of the TiO2 coating: deconvolution of the O 1 s peak into $TiO_2$ and $SiO_2$ yields an O:Ti ratio of 2.3:

These results demonstrate the realization of NPSi with sub-10 nm, ultra-high aspect ratio pores, which can be made functional via the ALD deposition of $TiO_2$. By leveraging interfacial effects and the nature of film formation, sub-5 nm noble metal islands are nucleated on silicon uniformly over multiple square centimeters. The developed technique is advantageous when compared to other MACE schemes due to the islands' narrow size distribution and planar interface with the Si, reducing the occurrence of unwanted etching effects resulting from nanoparticle facets and substrate contact surface area. These islands are shown to etch pores with aspect ratios as high as 400:1 for both Au and Ag catalysts. The resulting highly porous substrates are then coated with a functional layer of $TiO_2$ via ALD to demonstrate the potential functionality of NPSi.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of," "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Any terms as used herein related to shape and/or geometric relationship of or between, for example, one or more articles, structures, and/or subcomponents thereof and/or combinations thereof and/or any other tangible or intangible elements not listed above amenable to characterization by such terms, unless otherwise defined or indicated, shall be understood to not require absolute conformance to a mathematical definition of such term, but, rather, shall be understood to indicate conformance to the mathematical definition of such term to the extent possible for the subject matter so characterized as would be understood by one skilled in the art most closely related to such subject matter. Examples of such terms related to shape and/or geometric relationship include, but are not limited to terms descriptive of: shape—such as, round, square, circular/circle, rectangular/rectangle, triangular/triangle, cylindrical/cylinder, elliptical/ellipse, (n)polygonal/(n)polygon, etc.; surface and/or bulk material properties and/or spatial/temporal resolution and/or distribution—such as, smooth, reflective, transparent, clear, opaque, rigid, impermeable, uniform(ly), inert, non-wettable, insoluble, steady, invariant, constant, homogeneous, etc.; as well as many others that would be apparent to those skilled in the relevant arts. As one example, a fabricated article that would described herein as being "square" would not require such article to have faces or sides that are perfectly planar or linear and that intersect at angles of exactly 90 degrees (indeed, such an article can only exist as a mathematical abstraction), but rather, the shape of such article should be interpreted as approximating a "square," as defined mathematically, to an extent typically achievable and achieved for the recited fabrication technique as would be understood by those skilled in the art or as specifically described.

What is claimed is:

1. A nanoporous semiconductor material, comprising:
   a semiconductor material; and
   a plurality of pores in a surface of the semiconductor material, the plurality of pores having an average pore diameter of less than 10 nm, and wherein the plurality of pores define a total pore area that is greater than or equal to 10% of a surface area of the surface of the semiconductor material,
   wherein the plurality of pores has an average inter-pore spacing of less than 10 nm.

2. The nanoporous semiconductor material of claim 1, wherein each pore of the plurality of pores includes a noble metal nanoparticle disposed within the pore.

3. The nanoporous semiconductor material of claim 2, wherein the noble metal nanoparticle is at least one of a gold nanoparticle and a silver nanoparticle.

4. The nanoporous semiconductor material of claim 1, wherein the plurality of pores are etched into the surface of the semiconductor material.

5. The nanoporous semiconductor material of claim 1, wherein the plurality of pores have an average aspect ratio of greater than 75:1.

6. The nanoporous semiconductor material of claim 5, wherein the plurality of pores have an average aspect ratio of greater than 375:1.

7. The nanoporous semiconductor material of claim 1, wherein the semiconductor material is silicon.

8. The nanoporous semiconductor material of claim 1, further comprising a functional layer on a surface of each pore of the plurality of pores.

9. The nanoporous semiconductor material of claim 8, wherein the functional layer comprises at least one of $Al_2O_3$ and $TiO_2$.

10. The nanoporous semiconductor material of claim 1, wherein the plurality of pores comprises essentially cylindrical pores.

11. The nanoporous semiconductor material of claim 1, wherein the plurality of pores are normal to the surface of the semiconductor material.

* * * * *